United States Patent
Maassen

(10) Patent No.: US 12,183,543 B2
(45) Date of Patent: Dec. 31, 2024

(54) MULTI-MODAL OPERATIONS FOR MULTI-BEAM INSPECTION SYSTEM

(71) Applicant: ASML NETHERLANDS B.V., Veldhoven (NL)

(72) Inventor: Martinus Gerardus Johannes Maria Maassen, San Francisco, CA (US)

(73) Assignee: ASML Netherlands B.V., Veldhoven (NL)

( * ) Notice: Subject to any disclaimer, the term of this patent is extended or adjusted under 35 U.S.C. 154(b) by 280 days.

(21) Appl. No.: 17/785,890

(22) PCT Filed: Dec. 18, 2020

(86) PCT No.: PCT/EP2020/086912
§ 371 (c)(1),
(2) Date: Jun. 15, 2022

(87) PCT Pub. No.: WO2021/123082
PCT Pub. Date: Jun. 24, 2021

(65) Prior Publication Data
US 2023/0019113 A1 Jan. 19, 2023

Related U.S. Application Data
(60) Provisional application No. 62/951,850, filed on Dec. 20, 2019.

(51) Int. Cl.
*H01J 37/28* (2006.01)
*H01J 37/04* (2006.01)

(52) U.S. Cl.
CPC ............ *H01J 37/28* (2013.01); *H01J 37/045* (2013.01); *H01J 2237/0435* (2013.01); *H01J 2237/0453* (2013.01)

(58) Field of Classification Search
CPC ...... H01J 37/28; H01J 37/3177; H01J 37/045; H01J 2237/0435; H01J 2237/0453
See application file for complete search history.

(56) References Cited

U.S. PATENT DOCUMENTS
| | | | |
|---|---|---|---|
| 7,449,701 B2 | 11/2008 | Fujimaki et al. | |
| 9,281,162 B2 | 3/2016 | White et al. | |
| (Continued) | | | |

FOREIGN PATENT DOCUMENTS
| | | |
|---|---|---|
| CN | 101248505 B | 12/2010 |
| CN | 105161393 A | 12/2015 |
| (Continued) | | |

OTHER PUBLICATIONS
Office Action issued by the Intellectual Property Office (IPO) in related ROC (Taiwan) Patent Application No. 109144852, mailed Sep. 30, 2021 (16 pgs.).
(Continued)

*Primary Examiner* — Sean M Luck
(74) *Attorney, Agent, or Firm* — FINNEGAN, HENDERSON, FARABOW, GARRETT & DUNNER LLP

(57) ABSTRACT

Apparatuses, systems, and methods for multi-modal operations of a multi-beam inspection system are disclosed. An apparatus for generating multi-modal beamlets may include an aperture array which includes a first group of apertures having a first size and a second group of apertures having a second size different from the first size, the second group of apertures adjoining the first group of apertures, in which the first group of apertures and the second group of apertures are in different pass-or-block statuses. A multi-beam apparatus of multi-modal inspection operations may include the aforementioned apparatus, a source configured to emit charged particles, a condenser system configured to set a projection
(Continued)

area of the charged particles, and circuitry for controlling the first and second groups of apertures.

15 Claims, 17 Drawing Sheets

(56) References Cited

U.S. PATENT DOCUMENTS

| | | |
|---|---|---|
| 9,384,938 B2 | 7/2016 | Zeidler et al. |
| 9,778,377 B2 | 10/2017 | Mele et al. |
| 2008/0230697 A1 | 9/2008 | Tanimoto et al. |
| 2010/0038554 A1 | 2/2010 | Platzgummer et al. |
| 2011/0272576 A1 | 11/2011 | Otaki et al. |
| 2013/0187046 A1 | 7/2013 | Zeidler et al. |
| 2013/0299697 A1 | 11/2013 | Enyama et al. |
| 2015/0090879 A1* | 4/2015 | Zeidler .................. H01J 37/28 250/311 |
| 2015/0311031 A1* | 10/2015 | Platzgummer ........ H01J 37/147 250/396 R |
| 2016/0155603 A1 | 6/2016 | Zeidler et al. |
| 2017/0076905 A1 | 3/2017 | Borodovsky et al. |
| 2017/0133199 A1* | 5/2017 | Lee ........................ H01J 37/302 |
| 2017/0271118 A1* | 9/2017 | Matsumoto ............. H01J 37/24 |

FOREIGN PATENT DOCUMENTS

| | | |
|---|---|---|
| CN | 108352292 A | 7/2018 |
| JP | 6208653 B2 | 10/2017 |
| TW | I288424 B | 10/2007 |
| WO | WO 2009/127658 A1 | 10/2009 |

OTHER PUBLICATIONS

International Search Report and Written Opinion received from the International Search Authority issued in related International Application No. PCT/EP2020/086912 mailed Jun. 7, 2021 (20 pgs.).
Fujioka, H., et al., "Electron Beam Blanking Systems." Scanning 5.1 (1983): 3-13, Jan. 1, 1983 (11 pgs.).

* cited by examiner

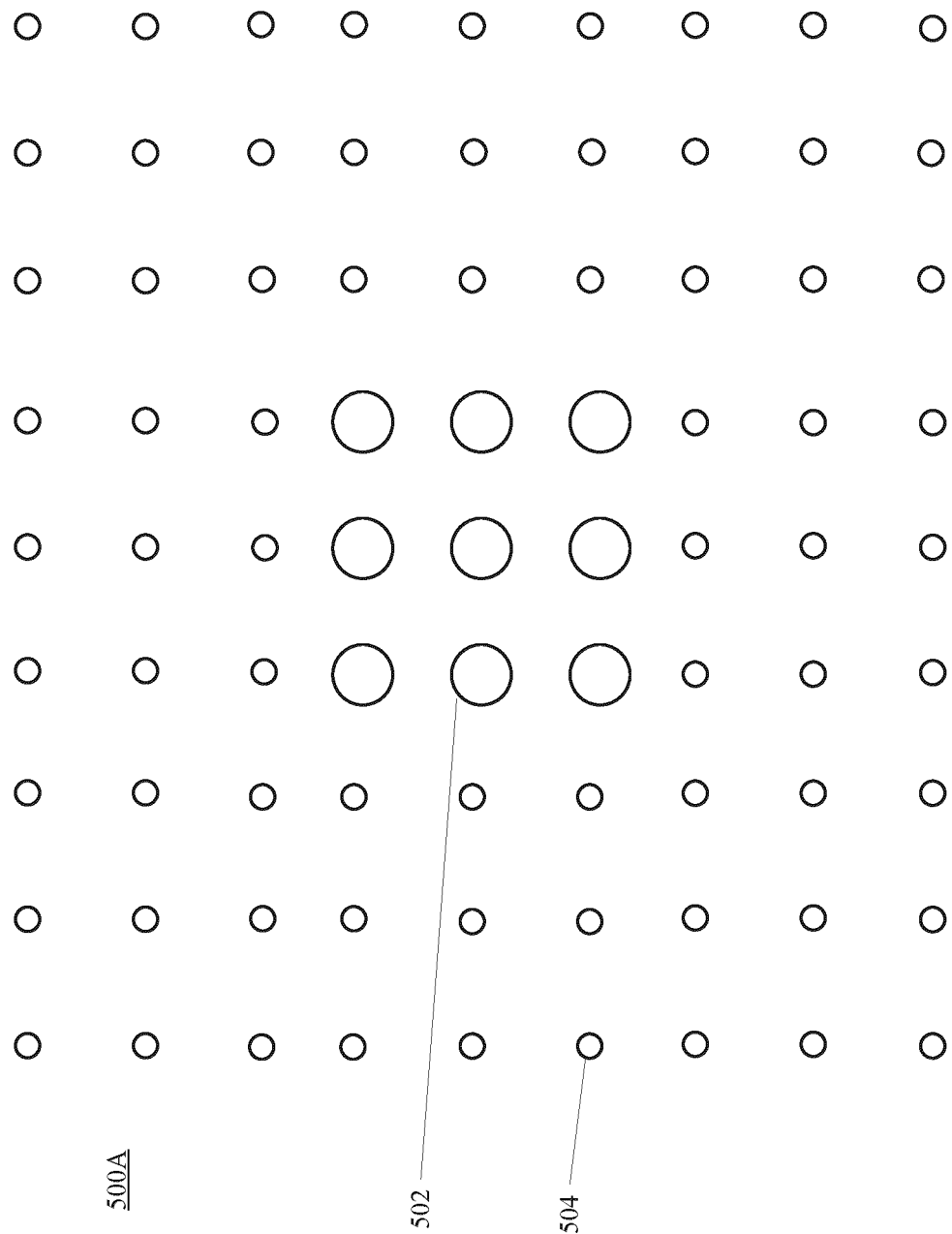

500C

500E

500B

500D

MULTI-MODAL OPERATIONS FOR MULTI-BEAM INSPECTION SYSTEM

CROSS-REFERENCE TO RELATED APPLICATIONS

This application claims priority to International Application No. PCT/EP2020/086912, filed Dec. 18, 2020, and published as WO 2021/123082 A1, which claims priority of U.S. application 62/951,850 which was filed on Dec. 20, 2019. The contents of these applications are incorporated herein by reference in their entireties.

FIELD

The description herein relates to the field of charged particle beam systems, and more particularly to multi-modal operations for multi-beam inspection systems.

BACKGROUND

In manufacturing processes of integrated circuits (ICs), unfinished or finished circuit components are inspected to ensure that they are manufactured according to design and are free of defects. Inspection systems utilizing optical microscopes or charged particle (e.g., electron) beam microscopes, such as a scanning electron microscope (SEM) can be employed. SEM delivers low energy electrons (e.g., <1 keV) to a surface and records secondary or backscattered electrons leaving the surface using a detector. By recording such electrons for different excitation positions on the surface, an image can be created with a spatial resolution in the order of nanometers.

The SEM may be a single-beam system or a multi-beam system. A single-beam SEM uses a single electron beam to scan the surface, while a multi-beam SEM uses multiple electron beams to scan the surface simultaneously. The multi-beam system may achieve a higher throughput of imaging compared with the single-beam system. However, the multi-beam system also has more complicated structures, due to which it lacks some structural flexibility compared with the single-beam system. Also, due to its higher complexity, the multi-beam SEM is more prone to operational errors and problems compared with the single-beam SEM.

SUMMARY

Embodiments of the present disclosure provide apparatuses, systems, and methods for multi-modal operations of a multi-beam inspection tool. In some embodiments, an apparatus for generating multi-modal beamlets may include an aperture array which includes a first group of apertures having a first size and a second group of apertures having a second size different from the first size, in which the first group of apertures and the second group of apertures are configured to operate in different pass-or-block statuses, and wherein an aperture in a pass status enables a beam to pass through the aperture, and the aperture in a block status stops the beam from passing through the aperture.

In some embodiments, a multi-beam apparatus of multi-modal inspection operations may include a source configured to emit charged particles. The multi-beam apparatus may also include a condenser system configured to set a projection area of the charged particles. The multi-beam apparatus may further include an aperture array configured to generate beamlets from the charged particles in the projection area, in which the aperture array may include a first group of apertures having a first size and a second group of apertures having a second size different from the first size. The multi-beam apparatus may further include circuitry for controlling the first group of apertures and the second group of apertures to operate in different pass-or-block statuses, wherein an aperture in a pass status enables a beam to pass through the aperture, and the aperture in a block status stops the beam from passing through the aperture.

In some embodiments, a method for multi-modal operations of a multi-beam inspection system may include receiving charged particles in the multi-beam inspection system. The method may also include, based on an operation mode of the multi-beam inspection system, generating beamlets using an aperture array by controlling the subset of apertures to operate in a pass status to enable beamlets to pass through the subset of apertures, and controlling apertures other than the subset of apertures in the aperture array to be in a block status to stop beamlets from passing through the apertures other than the subset of apertures.

In some embodiments, a non-transitory computer readable medium is disclosed. The non-transitory computer readable medium may store a set of instructions that is executable by at least one processor of an apparatus to cause the apparatus to perform a method for multi-modal operations of a multi-beam inspection system. The method may include selecting an operation mode of the multi-beam inspection system. The method may also include, based on an operation mode of the multi-beam inspection system, generating beamlets using an aperture array by controlling a first set of apertures of the aperture array to operate in a pass status to enable beamlets to pass through the first set of apertures and controlling a second set of apertures of the aperture array to operate in a block status to stop beamlets from passing through the second set of apertures.

In some embodiments, an apparatus is disclosed. The apparatus may include an aperture array. The aperture array may include a first group of apertures having a first size to enable a first set of beamlets each with a first beam current. The aperture array may also include a second group of apertures having a second size to enable a second set of beamlets each with a second beam current, the first and second beam currents being different currents and the first size and the second size being different sizes. The first group of apertures and the second group of apertures may be configured to operate in a pass status or a block status, wherein a selected aperture in the pass status may enable a selected beam to pass through the selected aperture, and wherein the selected aperture in the block status may prevent the selected beam from passing through the selected aperture

BRIEF DESCRIPTION OF THE DRAWINGS

FIGS. 5A-5I are diagrammatic illustrations of example aperture arrays for generating beamlets, consistent with embodiments of the present disclosure.

DETAILED DESCRIPTION

Figure 1:
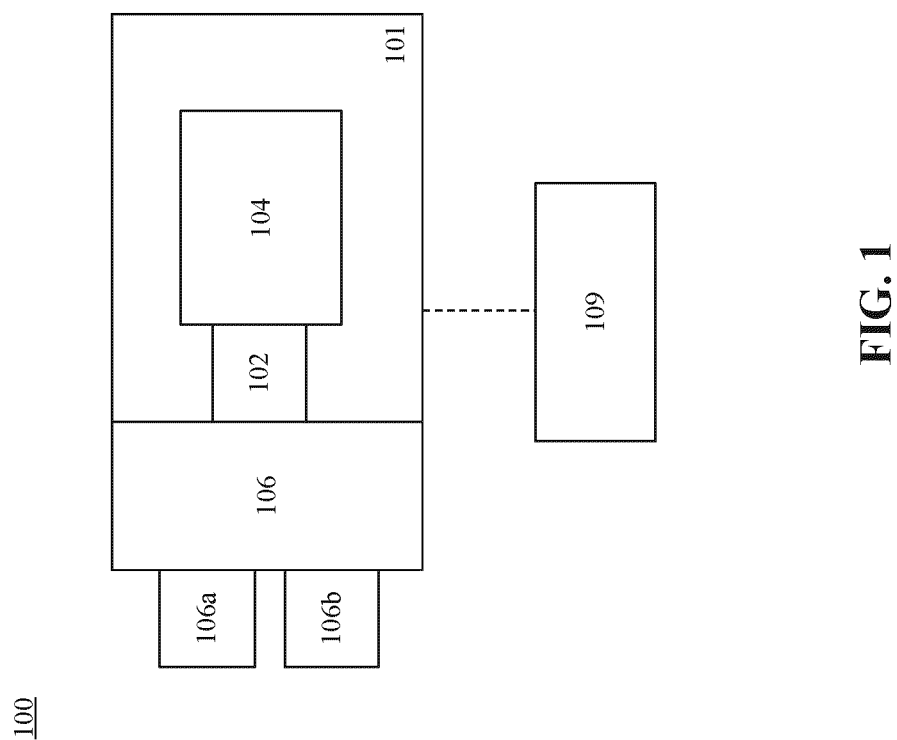
FIG. 1 is a schematic diagram illustrating an exemplary electron beam inspection (EBI) system, consistent with embodiments of the present disclosure.

Reference will now be made in detail to exemplary embodiments, examples of which are illustrated in the accompanying drawings. The following description refers to the accompanying drawings in which the same numbers in different drawings represent the same or similar elements unless otherwise represented. The implementations set forth in the following description of exemplary embodiments do not represent all implementations consistent with the disclosure. Instead, they are merely examples of apparatuses and methods consistent with aspects related to the subject matter recited in the appended claims. For example, although some embodiments are described in the context of utilizing electron beams, the disclosure is not so limited. Other types of charged particle beams may be similarly applied. Furthermore, other imaging systems may be used, such as optical imaging, photodetection, x-ray detection, or the like.

Electronic devices are constructed of circuits formed on a piece of silicon called a substrate. Many circuits may be formed together on the same piece of silicon and are called integrated circuits or ICs. The size of these circuits has decreased dramatically so that many more of them can fit on the substrate. For example, an IC chip in a smart phone can be as small as a thumbnail and yet may include over 2 billion transistors, the size of each transistor being less than 1/1000th the size of a human hair.

Making these extremely small ICs is a complex, time-consuming, and expensive process, often involving hundreds of individual steps. Errors in even one step have the potential to result in defects in the finished IC rendering it useless. Thus, one goal of the manufacturing process is to avoid such defects to maximize the number of functional ICs made in the process, that is, to improve the overall yield of the process.

One component of improving yield is monitoring the chip making process to ensure that it is producing a sufficient number of functional integrated circuits. One way to monitor the process is to inspect the chip circuit structures at various stages of their formation. Inspection can be carried out using a scanning electron microscope (SEM). A SEM can be used to image these extremely small structures, in effect, taking a "picture" of the structures of the wafer. The image can be used to determine if the structure was formed properly and also if it was formed in the proper location. If the structure is defective, then the process can be adjusted so the defect is less likely to recur.

The working principle of a SEM is similar to a camera. A camera takes a picture by receiving and recording brightness and colors of light reflected or emitted from people or objects. A SEM takes a "picture" by receiving and recording energies or quantities of electrons reflected or emitted from the structures. Before taking such a "picture," an electron beam may be provided onto the structures, and when the electrons are reflected or emitted ("exiting") from the structures, a detector of the SEM may receive and record the energies or quantities of those electrons to generate an image. To take such a "picture," some SEMs use a single electron beam (referred to as a "single-beam SEM"), while some SEMs use multiple electron beams (referred to as a "multi-beam SEM") to take multiple "pictures" of the wafer. By using multiple electron beams, the SEM may provide more electron beams onto the structures for obtaining these multiple "pictures," resulting in more electrons exiting from the structures. Accordingly, the detector may receive more exiting electrons simultaneously, and generate images of the structures of the wafer with a higher efficiency and a faster speed.

In a multiple charged-particle beam imaging system (e.g., a multi-beam SEM), an aperture array may be used for forming multiple beamlets. The aperture array may include multiple through holes ("apertures") that may split a single charged-particle beam into multiple beamlets. The energies of the beamlets depend on two factors, the energy of the single charged-particle beam and the size of the apertures. The higher the energy of the single charged-particle beam is, the higher energy each beamlet may have. Also, the larger the apertures are, the higher energy each beamlet may have (due to higher beam current).

The energies of the beamlets may affect two performance metrics of the multiple charged-particle beam imaging system, throughput and resolution. The throughput indicates how fast the imaging system can complete an inspection task in unit time. The resolution indicates at what quality the imaging system can perform the inspection task. During an inspection process, the imaging system may generate images from scanning a surface of a sample. For defect inspection, the images may be required to have a certain level of brightness. The higher energy the beamlets have (e.g., the larger the apertures are), the faster an image may reach a required level of brightness, thus the higher throughput the imaging system may be. Also, the resolution of the image depends on pixel sizes of the image. For a specific aperture size, there exists a beamlet energy that yields the smallest pixel sizes of the image, thus yielding a high resolution of the inspection results. Any beamlet energy higher than (e.g., by increasing the energy of the single charged-particle beam) or lower than (e.g., by decreasing the energy of the single charged-particle beam) that beamlet energy may deteriorate the resolution of the inspection results.

In different applications of charged-particle beam imaging systems, users may have different preference in throughputs and resolutions. In a throughput-preferred mode that prioritizes inspection throughput, the imaging system may use larger apertures. In a resolution-preferred mode that prioritizes resolution of inspection result, the imaging system may use smaller apertures. To accommodate different applications, a single-beam imaging system may use a switchable aperture strip that has multiple apertures of multiple sizes aligned in a line. The switchable aperture strip may be mechanically movable to select a suitable aperture size for different applications desired by users.

However, multiple charged-particle beam imaging systems are typically designed for specific applications that require specific throughputs and resolutions, and thus lack the flexibilities of switching between different sizes of apertures. Compared with the single-beam imaging system, the multiple charged-particle beam imaging system has more components and more complex designs. To design a multi-size aperture array for the multiple charged-particle beam imaging system to work in multi-modal operations adapting to multiple applications remains as an extremely difficult engineering challenge.

This disclosure describes, among others, methods and systems for multi-modal operations for a multi-beam inspection system. In some embodiments, the multi-beam system may use an aperture array that has a first group of apertures and a second group of apertures, apertures of each group having the same size within the group and different sizes than the other group. The multi-beam inspection system may project charged-particle beams onto different groups of apertures. Also, the multi-beam inspection system may control the first and second groups of apertures to operate in different pass-or-block statuses (or "modes"), among others. Apertures in a "pass" status may let through an electron beam. Apertures in a "block" status may block an electron beam. Apertures in other statuses may focus or bend the electron beam, among others. When the multi-beam inspection system projects the charged-particle beams onto the first and second groups of apertures, the first group of apertures may operate in a pass status, and the second group of apertures may be in a block status. When the multi-beam inspection system projects the charged-particle beams onto the first and second groups of apertures, the first group of apertures may be in a block status, and the second group of apertures may operate in a pass status. Because of the different sizes of the apertures in the first and second groups of apertures, the multi-beam inspection system may have multiple modes of operations and adapt to multiple applications that have multiple preferences in throughputs and resolutions. Users may use this system to cover various applications without incurring significant costs.

Relative dimensions of components in drawings may be exaggerated for clarity. Within the following description of drawings, the same or like reference numbers refer to the same or like components or entities, and only the differences with respect to the individual embodiments are described.

As used herein, unless specifically stated otherwise, the term "or" encompasses all possible combinations, except where infeasible. For example, if it is stated that a component may include A or B, then, unless specifically stated otherwise or infeasible, the component may include A, or B, or A and B. As a second example, if it is stated that a component may include A, B, or C, then, unless specifically stated otherwise or infeasible, the component may include A, or B, or C, or A and B, or A and C, or B and C, or A and B and C.

FIG. 1 illustrates an exemplary electron beam inspection (EBI) system 100 consistent with embodiments of the present disclosure. EBI system 100 may be used for imaging. As shown in FIG. 1, EBI system 100 includes a main chamber 101, a load/lock chamber 102, an electron beam tool 104, and an equipment front end module (EFEM) 106. Electron beam tool 104 is located within main chamber 101. EFEM 106 includes a first loading port 106a and a second loading port 106b. EFEM 106 may include additional loading port(s). First loading port 106a and second loading port 106b receive wafer front opening unified pods (FOUPs) that contain wafers (e.g., semiconductor wafers or wafers made of other material(s)) or samples to be inspected (wafers and samples may be used interchangeably). A "lot" is a plurality of wafers that may be loaded for processing as a batch.

One or more robotic arms (not shown) in EFEM 106 may transport the wafers to load/lock chamber 102. Load/lock chamber 102 is connected to a load/lock vacuum pump system (not shown) which removes gas molecules in load/lock chamber 102 to reach a first pressure below the atmospheric pressure. After reaching the first pressure, one or more robotic arms (not shown) may transport the wafer from load/lock chamber 102 to main chamber 101. Main chamber 101 is connected to a main chamber vacuum pump system (not shown) which removes gas molecules in main chamber 101 to reach a second pressure below the first pressure. After reaching the second pressure, the wafer is subject to inspection by electron beam tool 104. Electron beam tool 104 may be a single-beam system or a multi-beam system.

A controller 109 is electronically connected to electron beam tool 104. Controller 109 may be a computer configured to execute various controls of EBI system 100. While controller 109 is shown in FIG. 1 as being outside of the structure that includes main chamber 101, load/lock chamber 102, and EFEM 106, it is appreciated that controller 109 may be a part of the structure.

In some embodiments, controller 109 may include one or more processors (not shown). A processor may be a generic or specific electronic device capable of manipulating or processing information. For example, the processor may include any combination of any number of a central processing unit (or "CPU"), a graphics processing unit (or "GPU"), an optical processor, a programmable logic controllers, a microcontroller, a microprocessor, a digital signal processor, an intellectual property (IP) core, a Programmable Logic Array (PLA), a Programmable Array Logic (PAL), a Generic Array Logic (GAL), a Complex Programmable Logic Device (CPLD), a Field-Programmable Gate Array (FPGA), a System On Chip (SoC), an Application-Specific Integrated Circuit (ASIC), and any type circuit capable of data processing. The processor may also be a virtual processor that includes one or more processors distributed across multiple machines or devices coupled via a network.

In some embodiments, controller 109 may further include one or more memories (not shown). A memory may be a generic or specific electronic device capable of storing codes and data accessible by the processor (e.g., via a bus). For example, the memory may include any combination of any number of a random-access memory (RAM), a read-only memory (ROM), an optical disc, a magnetic disk, a hard drive, a solid-state drive, a flash drive, a security digital (SD) card, a memory stick, a compact flash (CF) card, or any type of storage device. The codes may include an operating system (OS) and one or more application programs (or "apps") for specific tasks. The memory may also be a virtual memory that includes one or more memories distributed across multiple machines or devices coupled via a network.

Figure 2:
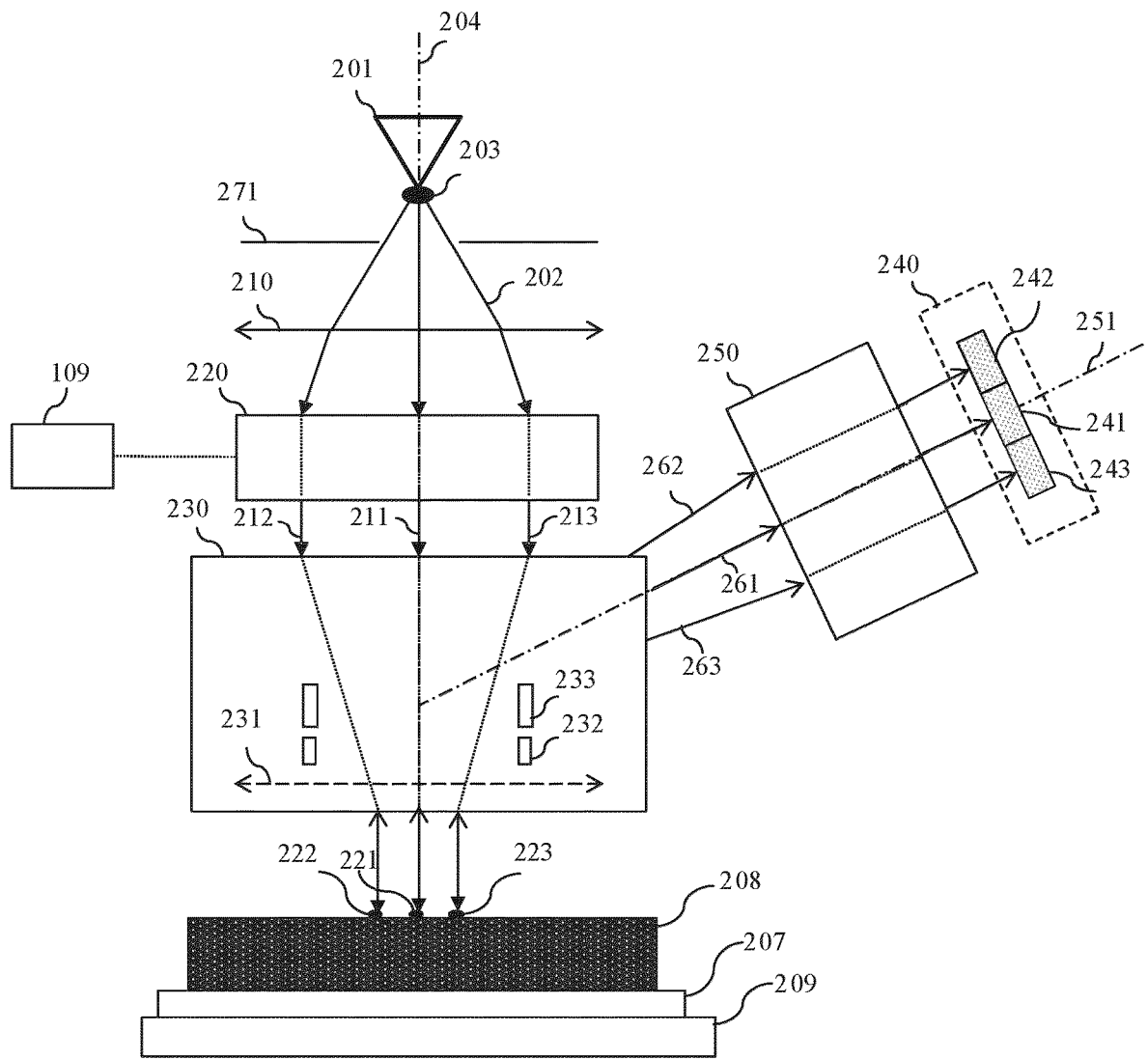
FIG. 2 is a schematic diagram illustrating an exemplary multi-beam system that is part of the exemplary charged particle beam inspection system of FIG. 1, consistent with embodiments of the present disclosure.

Reference is now made to FIG. 2, which is a schematic diagram illustrating an exemplary electron beam tool 104 including a multi-beam inspection tool that is part of the EBI system 100 of FIG. 1, consistent with embodiments of the present disclosure. Multi-beam electron beam tool 104 (also referred to herein as apparatus 104) comprises an electron source 201, a Coulomb aperture plate (or "gun aperture plate") 271, a condenser lens 210, a source conversion unit 220, a primary projection system 230, a motorized stage 209, and a sample holder 207 supported by motorized stage 209 to hold a sample 208 (e.g., a wafer or a photomask) to be inspected. Multi-beam electron beam tool 104 may further comprise a secondary projection system 250 and an electron detection device 240. Primary projection system 230 may comprise an objective lens 231. Electron detection device 240 may comprise a plurality of detection elements 241, 242, and 243. A beam separator 233 and a deflection scanning unit 232 may be positioned inside primary projection system 230.

Electron source 201, Coulomb aperture plate 271, condenser lens 210, source conversion unit 220, beam separator 233, deflection scanning unit 232, and primary projection system 230 may be aligned with a primary optical axis 204 of apparatus 104. Secondary projection system 250 and electron detection device 240 may be aligned with a secondary optical axis 251 of apparatus 104.

Electron source 201 may comprise a cathode (not shown) and an extractor or anode (not shown), in which, during operation, electron source 201 is configured to emit primary electrons from the cathode and the primary electrons are extracted or accelerated by the extractor and/or the anode to form a primary electron beam 202 that form a primary beam crossover (virtual or real) 203. Primary electron beam 202 may be visualized as being emitted from primary beam crossover 203.

Source conversion unit 220 may comprise an image-forming element array (not shown), an aberration compensator array (not shown), a beam-limit aperture array (not shown), and a pre-bending micro-deflector array (not shown). In some embodiments, the pre-bending micro-deflector array deflects a plurality of primary beamlets 211, 212, 213 of primary electron beam 202 to normally enter the beam-limit aperture array, the image-forming element array, and an aberration compensator array. In some embodiment, condenser lens 210 is designed to focus primary electron beam 202 to become a parallel beam and be normally incident onto source conversion unit 220. The image-forming element array may comprise a plurality of micro-deflectors or micro-lenses to influence the plurality of primary beamlets 211, 212, 213 of primary electron beam 202 and to form a plurality of parallel images (virtual or real) of primary beam crossover 203, one for each of the primary beamlets 211, 212, and 213. In some embodiments, the aberration compensator array may comprise a field curvature compensator array (not shown) and an astigmatism compensator array (not shown). The field curvature compensator array may comprise a plurality of micro-lenses to compensate field curvature aberrations of the primary beamlets 211, 212, and 213. The astigmatism compensator array may comprise a plurality of micro-stigmators to compensate astigmatism aberrations of the primary beamlets 211, 212, and 213. The beam-limit aperture array may be configured to limit diameters of individual primary beamlets 211, 212, and 213. FIG. 2 shows three primary beamlets 211, 212, and 213 as an example, and it is appreciated that source conversion unit 220 may be configured to form any number of primary beamlets. Controller 109 may be connected to various parts of EBI system 100 of FIG. 1, such as source conversion unit 220, electron detection device 240, primary projection system 230, or motorized stage 209. In some embodiments, as explained in further details below, controller 109 may perform various image and signal processing functions. Controller 109 may also generate various control signals to govern operations of the charged particle beam inspection system.

Condenser lens 210 is configured to focus primary electron beam 202. Condenser lens 210 may further be configured to adjust electric currents of primary beamlets 211, 212, and 213 downstream of source conversion unit 220 by varying the focusing power of condenser lens 210. Alternatively, the electric currents may be changed by altering the radial sizes of beam-limit apertures within the beam-limit aperture array corresponding to the individual primary beamlets. The electric currents may be changed by both altering the radial sizes of beam-limit apertures and the focusing power of condenser lens 210. Condenser lens 210 may be an adjustable condenser lens that may be configured so that the position of its first principle plane is movable. The adjustable condenser lens may be configured to be magnetic, which may result in off-axis beamlets 212 and 213 illuminating source conversion unit 220 with rotation angles. The rotation angles change with the focusing power or the position of the first principal plane of the adjustable condenser lens. Condenser lens 210 may be an anti-rotation condenser lens that may be configured to keep the rotation angles unchanged while the focusing power of condenser lens 210 is changed. In some embodiments, condenser lens 210 may be an adjustable anti-rotation condenser lens, in which the rotation angles do not change when its focusing power and the position of its first principal plane are varied.

Objective lens 231 may be configured to focus beamlets 211, 212, and 213 onto a sample 208 for inspection and may form, in the current embodiments, three probe spots 221, 222, and 223 on the surface of sample 208. Coulomb aperture plate 271, in operation, is configured to block off peripheral electrons of primary electron beam 202 to reduce Coulomb effect. The Coulomb effect may enlarge the size of each of probe spots 221, 222, and 223 of primary beamlets 211, 212, 213, and therefore deteriorate inspection resolution.

Beam separator 233 may, for example, be a Wien filter comprising an electrostatic deflector generating an electrostatic dipole field and a magnetic dipole field (not shown in FIG. 2). In operation, beam separator 233 may be configured to exert an electrostatic force by electrostatic dipole field on individual electrons of primary beamlets 211, 212, and 213. The electrostatic force is equal in magnitude but opposite in direction to the magnetic force exerted by magnetic dipole field of beam separator 233 on the individual electrons. Primary beamlets 211, 212, and 213 may therefore pass at least substantially straight through beam separator 233 with at least substantially zero deflection angles.

Deflection scanning unit 232, in operation, is configured to deflect primary beamlets 211, 212, and 213 to scan probe spots 221, 222, and 223 across individual scanning areas in a section of the surface of sample 208. In response to incidence of primary beamlets 211, 212, and 213 or probe spots 221, 222, and 223 on sample 208, electrons emerge from sample 208 and generate three secondary electron beams 261, 262, and 263. Each of secondary electron beams 261, 262, and 263 typically comprise secondary electrons (having electron energy≤50 eV) and backscattered electrons (having electron energy between 50 eV and the landing energy of primary beamlets 211, 212, and 213). Beam separator 233 is configured to deflect secondary electron beams 261, 262, and 263 towards secondary projection system 250. Secondary projection system 250 subsequently focuses secondary electron beams 261, 262, and 263 onto detection elements 241, 242, and 243 of electron detection device 240. Detection elements 241, 242, and 243 are arranged to detect corresponding secondary electron beams 261, 262, and 263 and generate corresponding signals which are sent to controller 109 or a signal processing system (not shown), e.g., to construct images of the corresponding scanned areas of sample 208.

In some embodiments, detection elements 241, 242, and 243 detect corresponding secondary electron beams 261, 262, and 263, respectively, and generate corresponding intensity signal outputs (not shown) to an image processing system (e.g., controller 109). In some embodiments, each detection element 241, 242, and 243 may comprise one or more pixels. The intensity signal output of a detection element may be a sum of signals generated by all the pixels within the detection element.

In some embodiments, controller 109 may comprise image processing system that includes an image acquirer (not shown), a storage (not shown). The image acquirer may comprise one or more processors. For example, the image acquirer may comprise a computer, server, mainframe host, terminals, personal computer, any kind of mobile computing devices, and the like, or a combination thereof. The image acquirer may be communicatively coupled to electron detection device 240 of apparatus 104 through a medium such as an electrical conductor, optical fiber cable, portable storage media, IR, Bluetooth, internet, wireless network, wireless radio, among others, or a combination thereof. In some embodiments, the image acquirer may receive a signal from electron detection device 240 and may construct an image. The image acquirer may thus acquire images of sample 208. The image acquirer may also perform various post-processing functions, such as generating contours, superimposing indicators on an acquired image, and the like. The image acquirer may be configured to perform adjustments of brightness and contrast, etc. of acquired images. In some embodiments, the storage may be a storage medium such as a hard disk, flash drive, cloud storage, random access memory (RAM), other types of computer readable memory, and the like. The storage may be coupled with the image acquirer and may be used for saving scanned raw image data as original images, and post-processed images.

In some embodiments, the image acquirer may acquire one or more images of a sample based on an imaging signal received from electron detection device 240. An imaging signal may correspond to a scanning operation for conducting charged particle imaging. An acquired image may be a single image comprising a plurality of imaging areas. The single image may be stored in the storage. The single image may be an original image that may be divided into a plurality of regions. Each of the regions may comprise one imaging area containing a feature of sample 208. The acquired images may comprise multiple images of a single imaging area of sample 208 sampled multiple times over a time sequence. The multiple images may be stored in the storage. In some embodiments, controller 109 may be configured to perform image processing steps with the multiple images of the same location of sample 208.

In some embodiments, controller 109 may include measurement circuitries (e.g., analog-to-digital converters) to obtain a distribution of the detected secondary electrons. The electron distribution data collected during a detection time window, in combination with corresponding scan path data of each of primary beamlets 211, 212, and 213 incident on the wafer surface, can be used to reconstruct images of the wafer structures under inspection. The reconstructed images can be used to reveal various features of the internal or external structures of sample 208, and thereby can be used to reveal any defects that may exist in the wafer.

In some embodiments, controller 109 may control motorized stage 209 to move sample 208 during inspection of sample 208. In some embodiments, controller 109 may enable motorized stage 209 to move sample 208 in a direction continuously at a constant speed. In other embodiments, controller 109 may enable motorized stage 209 to change the speed of the movement of sample 208 overtime depending on the steps of scanning process.

Although FIG. 2 shows that apparatus 104 uses three primary electron beams, it is appreciated that apparatus 104 may use two or more number of primary electron beams. The present disclosure does not limit the number of primary electron beams used in apparatus 104.

Compared with a single charged-particle beam imaging system ("single-beam system"), a multiple charged-particle beam imaging system ("multi-beam system") may be designed for an application with specific throughput and resolution preferences and may lack flexibility of adapting to different requirements of throughputs and resolutions. To overcome those challenge, embodiments of this disclosure provide the multi-beam system with capability of adapting to different throughputs and resolution requirements. In some embodiments of this disclosure, sizes of numerical-aperture limiting aperture of the beamlet generation device (e.g., source conversion unit 220) of the multi-beam system (e.g., electron beam tool 104) may be adjustable. For ease of explanation without ambiguity, a size of a numerical-aperture limiting aperture may be referred to as an "aperture size" hereinafter. The numerical-aperture limiting apertures may be related to physical sizes of apertures of the beamlet generation device. Embodiments of this disclosure may provide the capability of adaptable aperture sizes by providing different physical sizes of apertures and a mechanism to use them for generating beamlets.

Figure 3:
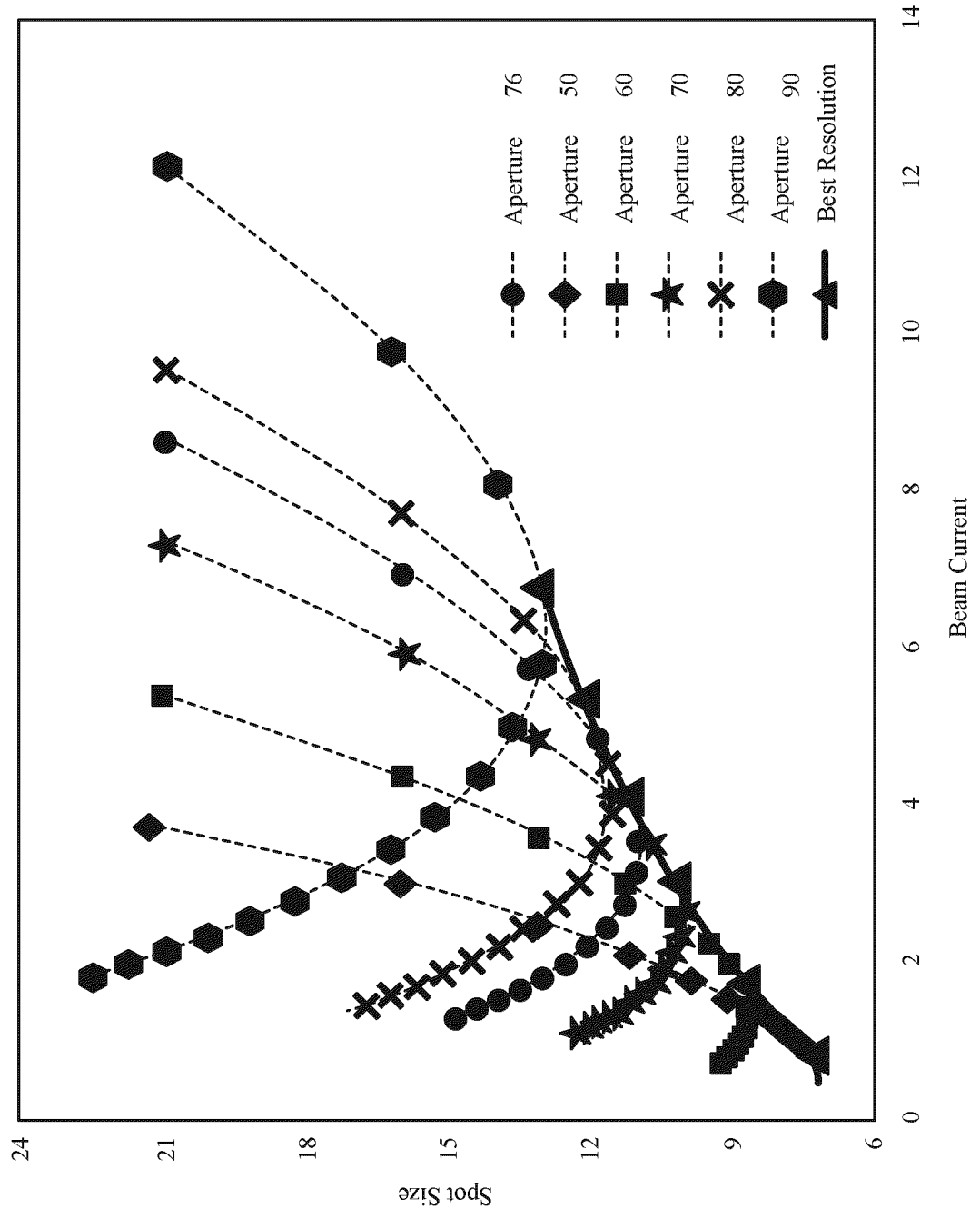
FIG. 3 is a diagrammatic illustration of example relationships between spot sizes and currents of a beamlet under different sizes of numerical-aperture limiting apertures, consistent with embodiments of the present disclosure.

FIG. 3 is a diagrammatic illustration of example relationships between spot sizes of a beamlet and currents of the beamlet under different sizes of numerical-aperture limiting apertures, consistent with embodiments of the present disclosure. In FIG. 3, the horizontal axis indicates strengths of beam currents that indicates energies of beamlets. The vertical axis in FIG. 3 indicates sizes of probe spots ("spot sizes," e.g., sizes of probe spots 221, 222, and 223).

Generally, a spot size of a beamlet is proportional to a pixel size of a scan image. The smaller that the pixel size is, the higher resolution of the scan image may have. Also, given the same aperture, the relationship between the beam currents and the spot sizes is not monotonically proportional. Generally, as the beam currents increase (i.e., the beamlet energies increase) from zero, the spot sizes of the beamlets may decrease at first but may increase again after the beam currents exceed a certain value. The beam currents may depend on at least the emission power of source 201 and focusing power of condenser lens 210 in FIG. 2. The higher emission that power source 201 applies, or the higher focusing power that condenser lens 210 applies, the higher the beam currents may be.

FIG. 3 shows six aperture sizes (i.e., sizes 50, 60, 70, 76, 80, and 90), in which the number values are proportional to the sizes of the apertures. That is, a larger number may represent a larger aperture size, and a smaller number may represent a smaller aperture size. For a given aperture size (e.g., any of sizes 50, 60, 70, 76, 80, and 90), there exists a beam current that yields the smallest spot size under the given aperture size, which may generate a high resolution than other spot sizes. Such a beam current may be at or near a local extremum (e g, minimum) point in a curve representing a relationship between spot sizes and beam currents under the given aperture size, as shown in FIG. 3. For ease of explanation without causing ambiguity, such a beam current may be referred to as an "optimal" current. Under the same aperture size, any beam current higher than or lower than the optimal beam current may increase the spot size, thus deteriorate the resolution of inspection results.

A "high-resolution curve" may be determined as an envelope of the smallest achievable spot sizes under different aperture sizes, as shown in FIG. 3. Along the high-resolution curve, the achievable optimal beam current may increase as the aperture size increases, and the achievable smallest spot sizes decrease as the aperture size decreases. The high-resolution curve shows the best resolutions that the multi-beam system may ideally achieve if the aperture sizes are adjustable.

For throughput-preferred applications, higher beam currents may be preferred, and larger aperture sizes may be used, as indicated by the upper-right end of the high-resolution curve. For resolution-preferred applications, smaller beam spots may be preferred, and smaller aperture sizes may be used, as indicated by the lower-left end of the high-resolution curve. However, the aperture size in a conventional multi-beam system may not be adjustable, thus limiting its capabilities of multi-modal operations for adapting to different applications, including the throughput-preferred applications and the resolution-preferred applications.

Figure 4A:
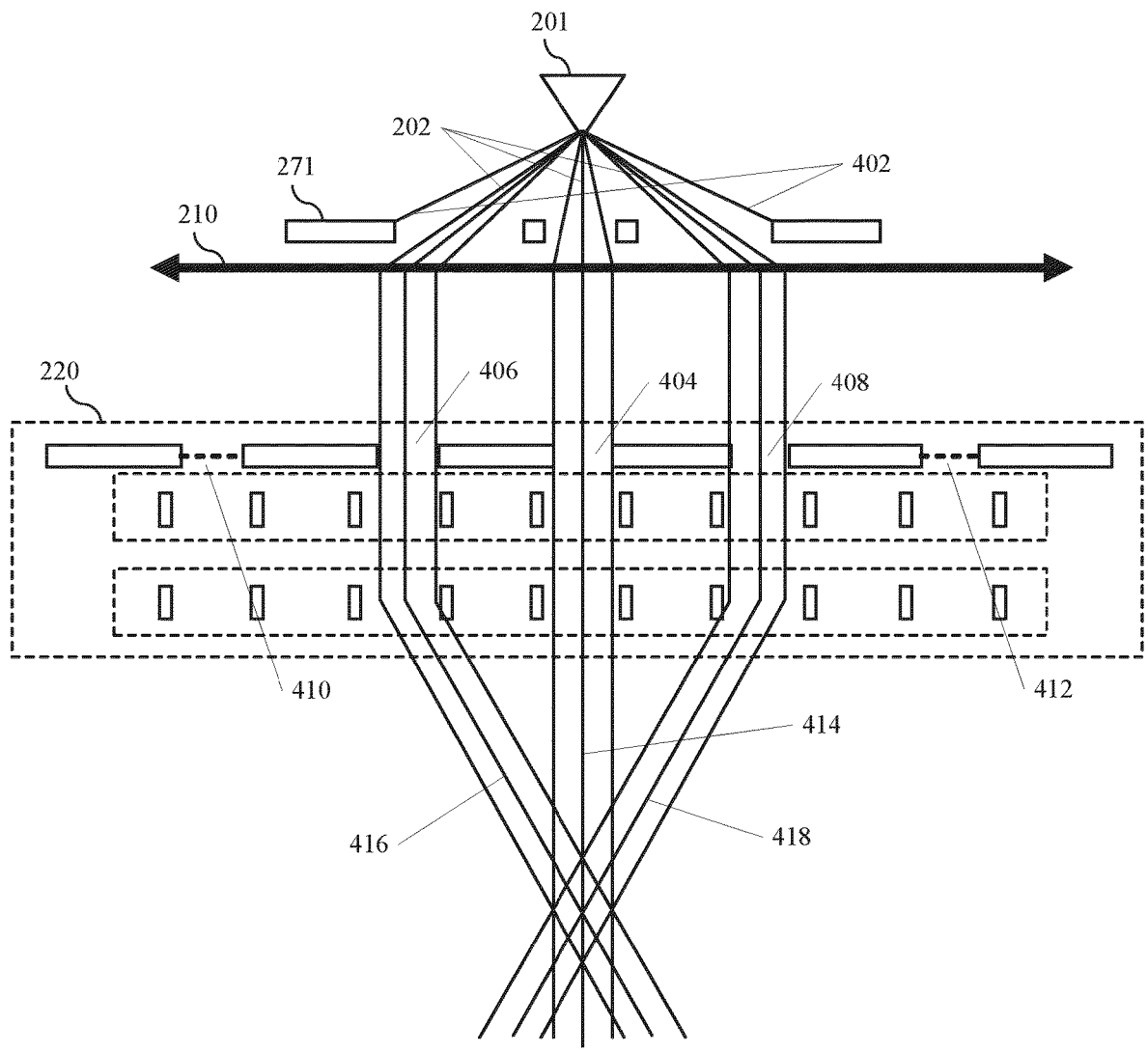
FIG. 4A is a diagrammatic illustration of beamlet generation in a first operation mode of a multi-beam system, consistent with embodiments of the present disclosure.
Figure 4B:
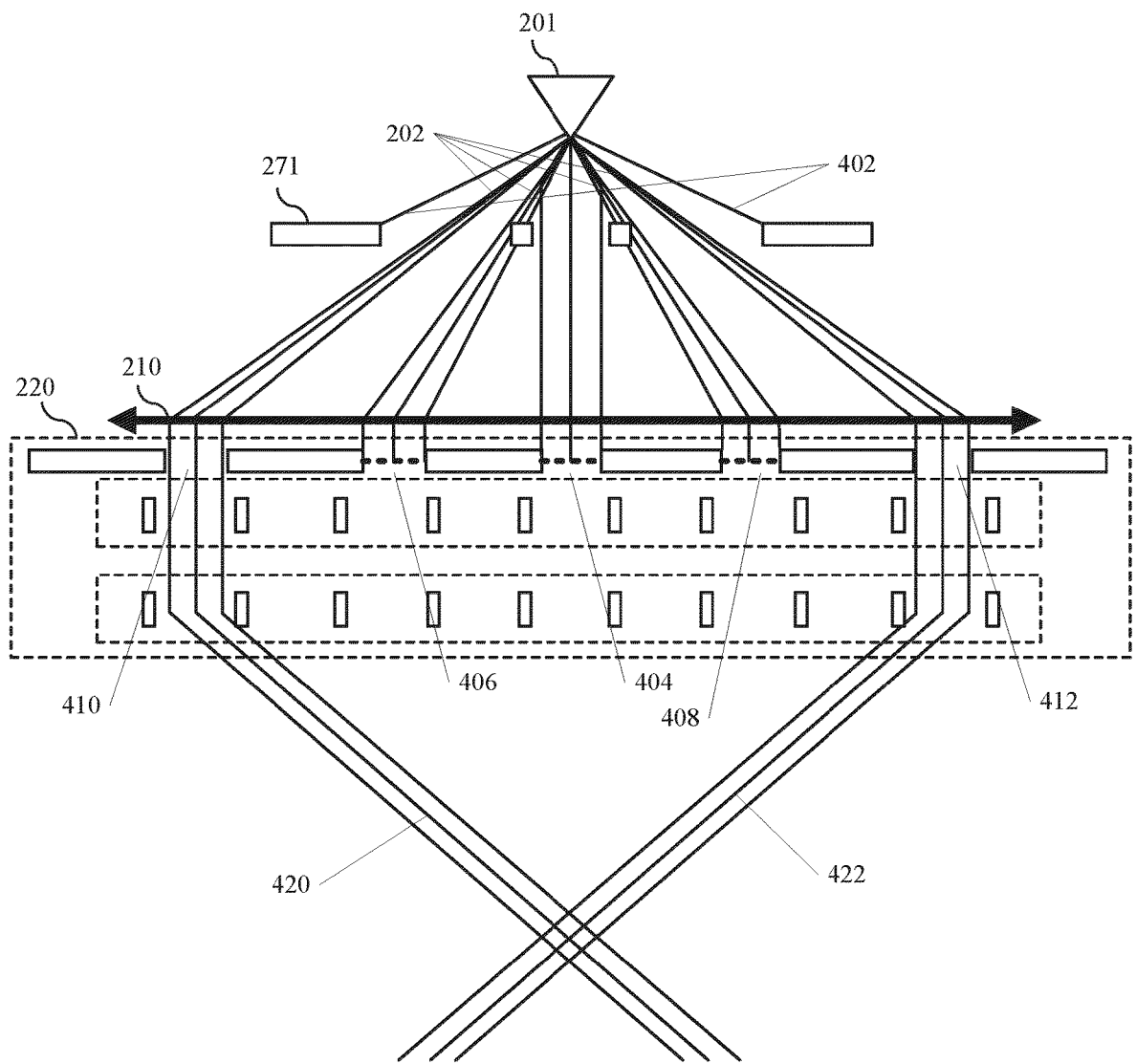
FIG. 4B is a diagrammatic illustration of beamlet generation in a second operation mode of the multi-beam system, consistent with embodiments of the present disclosure.

In some embodiments of this disclosure, an apparatus (e.g., implemented as component of source conversion unit 220) may be used for generating multi-modal beamlets for a multi-beam inspection system. The apparatus may include an aperture array that includes different sizes of apertures. The apertures of different sizes may be arranged such that a primary charged particle beam (e.g., primary electron beam 202) may irradiate at least a group of apertures of the same size at a time. By adjusting one or more parameters (e.g., a projection area) of the primary charged particle beam, the primary charged particle beam may be incident on one or more different groups of apertures of different sizes in accordance with demands of different applications, in which optimal aperture sizes may be selected, and optimal inspection results for each application may be obtained. In some cases, the primary charged particle beam is incident on all the different groups of apertures of different sizes. FIGS. 4A-4B illustrate beamlet generation in multiple operation modes of a multi-beam system that includes such an apparatus. In the example embodiments as shown in FIGS. 4A-4B, the multi-beam system may adjust the aperture size for generating beamlets, thus may have the capability of multi-modal operations for adapting to different applications, including the throughput-preferred applications and the resolution-preferred applications.

FIG. 4A is a diagrammatic illustration of beamlet generation in a first operation mode of a multi-beam system, consistent with embodiments of the present disclosure. For example, the first operation mode may be the throughput-preferred mode. In FIG. 4A, electron source 201 may emit electrons. Coulomb aperture plate 271 may block off peripheral electrons 402 of primary electron beam 202 to reduce Coulomb effect. Condenser lens 210 may focus primary electron beam 202 to become a parallel beam and be incident onto source conversion unit 220 in a normal direction. Condenser lens 210 may be an adjustable condenser lens as described in parts associated with FIG. 2. In FIG. 4A, a first principal plane of adjustable condenser lens 210 may be adjusted to be close to electron source 201, in which a projection area of primary electron beam 202 may be decreased. That is, the focus power of condenser lens 210 may be enhanced in FIG. 4A.

Source conversion unit 220 may include an aperture array. The aperture array may include apertures 404, 406, 408, 410, and 412. Because condenser lens 210 decreases the projection area of primary electron beam 202, primary electron beam 202 may only be incident onto a portion of the apertures of the aperture array. For example, in FIG. 4A, only apertures 404, 406, and 408 are projected by primary electron beam 202. Apertures of the aperture array or associated components may be controlled to operate in different pass-or-block statuses, to enable or disable electrons from primary electron beam 202 from passing through selected apertures. An aperture or associated component in a pass status may enable a beam to pass through the aperture, and the aperture or associated component in a block status may stop a beam from passing through the aperture.

Figure 4C:
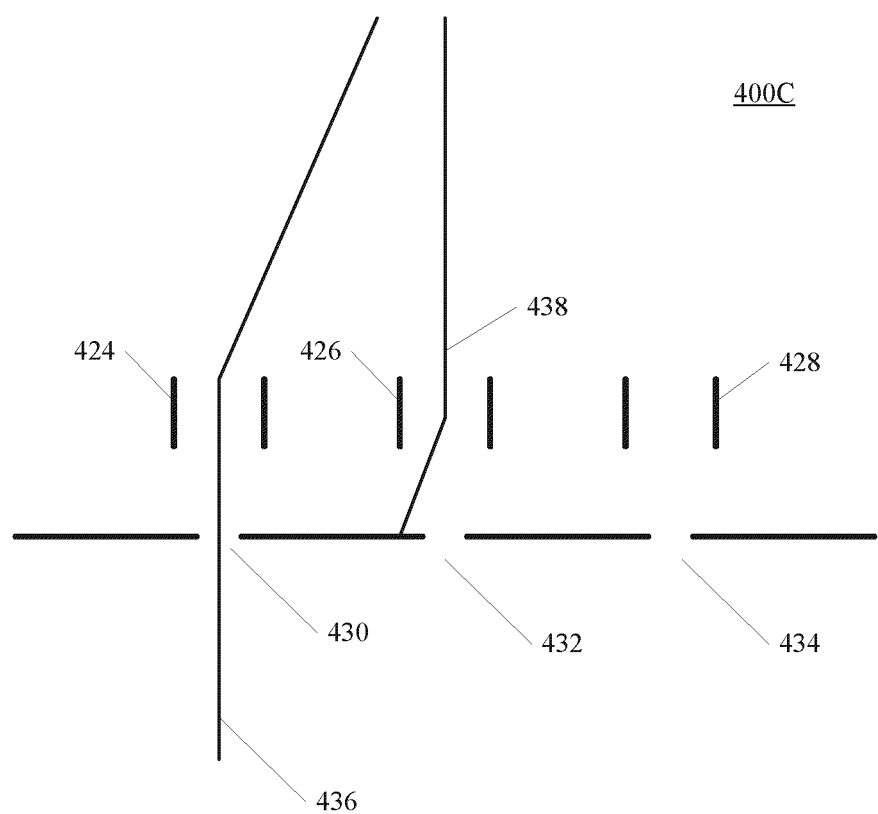
FIG. 4C is a diagrammatic illustration of a MEMS aperture array, consistent with embodiments of the present disclosure.

In some embodiments, the aperture array may be microelectromechanical systems (MEMS) aperture array, or the associated component may be a MEMS which may be part of a MEMS array, such as a MEMS aperture array. Each aperture of the MEMS aperture array may include a deflection structure (e.g., a magnetic coil, electric plates, or any electromagnetic beam deflecting device) and a chopping aperture downstream from the deflection structure. FIG. 4C is a diagrammatic illustration of a MEMS aperture array 400C, consistent with embodiments of the present disclosure. Aperture array 400C may include multiple deflection structures, including deflection structures 424, 426, and 428, corresponding to chopping apertures 430, 432, and 434, respectively. As shown in FIG. 4C, each chopping aperture may have a hole centrally aligned with the opening of the corresponding deflection structure. The hole of the chopping aperture may be smaller than the opening of the deflection structure. The apertures of aperture array 400C may be independently and individually controlled to be in pass statuses or block statuses. For example, chopping aperture 424 is controlled to be in a pass status, in which deflection structure 424 directs electron beam 436 entering deflection structure 424 to pass straight, and electron beam 436 may exit chopping aperture 430. For another example, chopping aperture 432 is controlled to be in a block status, in which deflection structure 426 directs electron beam 438 to be blanked (e.g., to be deflected away from the entering direction and hit on a wall of chopping aperture 432), and electron beam 438 may be stopped from passing through the hole of chopping aperture 432. In some embodiments, deflection structures 424, 426, and 428 are components associated with an aperture array that includes apertures 430, 432, and 434. Further, deflection structure 424 may be associated with aperture 430, deflection structure 426 may be associated with aperture 432, and deflection structure 428 may be associated with aperture 434. In such embodiments, the deflection structures may be part of a component or components that are separate from the aperture array.

Referring back to FIG. 4A, because primary electron beam 202 has an upper limit on its total energy, when the projection area of primary electron beam 202 decreases, the energy intensity irradiated onto each aperture may increase. That is, apertures 404, 406, and 408 may receive a high beam current in FIG. 4A. Apertures 404, 406, and 408 may have a different aperture size than apertures 410 and 412, while apertures 404, 406, and 408 may operate in a pass status to generate beamlets 414, 416, and 418, respectively, and apertures 410 and 412 may be in a block status (represented by horizontal black dotted lines in FIG. 4A) to block peripheral part of primary electron beam 202. For example, apertures 410 and 412 may be controlled to be in a block status similar to the configuration of deflection structure 426 and chopping structure 432 in FIG. 4C. Apertures 404, 406, and 408 may be controlled to be in a pass status similar to the configuration of deflection structure 424 and chopping structure 430 in FIG. 4C. The multi-beam system may be optimized to work in the throughput-preferred mode when apertures 404, 406, and 408 have a larger aperture size and the beam currents are adjusted to reach the optimal beam current for best resolution under their aperture size. That is, the best resolution achievable by the multi-beam system may reach the upper-right end of the high-resolution curve in FIG. 3. In the throughput-preferred mode, the beam currents of the beamlets are higher, and the spot sizes of the beamlets are large, thus allowing a higher throughput of inspection. For such a purpose, the aperture size of apertures 404, 406, and 408 may be designed to be larger than other apertures of the aperture array, such as apertures 410 and 412.

It should be noted that the number of beamlets generated in FIG. 4A is determined by an output angle of the primary electron beam 202 and the pass-or-block statuses of apertures projected by primary electron beam 202. For example, in FIG. 4A, primary electron beam 202 may project and cover apertures 404, 406, and 408. If all of apertures 404, 406, and 408 operate in the pass status, the number of generated beamlets is 3. If only a portion of apertures 404, 406, and 408 operates in the pass status (e.g., only aperture 404 operates in the pass status), the number of generated beamlets is less than 3 (e.g., 1). However, the upper limit of the number of the generated beamlets may be limited by the output angle of primary electron beam 202. For example, as shown in FIG. 4A, if primary electron beam 202 only covers apertures 404, 406, and 408 in its maximum output angle, the upper limit of the number of the generated beamlets may be 3.

FIG. 4B is a diagrammatic illustration of beamlet generation in a second operation mode of the multi-beam system, consistent with embodiments of the present disclosure. For example, the second operation mode may be the resolution-preferred mode. The configuration and function of electron source 201, Coulomb aperture plate 271, condenser lens 210, and source conversion unit 220 in FIG. 4B may be similar to that in FIG. 4A, except that the first principal plane of the adjustable condenser lens 210 may be moved to be distant from electron source 201, in which a projection area of primary electron beam 202 may be increased. That is, the focus power of condenser lens 210 may be weakened in FIG. 4B.

Because condenser lens 210 increases the projection area of primary electron beam 202, primary electron beam 202 may be incident onto a larger portion of the apertures of the aperture array than in FIG. 4A. For example, in FIG. 4B, apertures 404, 406, 408, 410, and 412 are projected by primary electron beam 202.

Because primary electron beam 202 has an upper limit on its total energy, when the projection area of primary electron beam 202 increases, the energy intensity irradiated onto each aperture may decrease. That is, apertures 404-412 in FIG. 4B may receive a beam current lower than that of the beam current received by apertures 404, 406, and 408 in FIG. 4A. Apertures 410 and 412 may operate in the pass status to generate beamlets 420 and 422, respectively, and apertures 404, 406, and 408 may be in the block status (represented by horizontal black dotted lines in FIG. 4A) to block central part of primary electron beam 202. For example, apertures 410 and 412 may be controlled to be in a pass status similar to the configuration of deflection structure 424 and chopping structure 430 in FIG. 4C. Apertures 404, 406, and 408 may be controlled to be in a block status similar to the configuration of deflection structure 426 and chopping structure 432 in FIG. 4C. When apertures 410 and 412 have a smaller aperture size, and the beam currents are adjusted to reach the optimal beam current for a better resolution under their aperture size, the multi-beam system may be optimized to work in the resolution-preferred mode. That is, the resolution achievable by the multi-beam system may reach the lower-left end of the high-resolution curve in FIG. 3. In the resolution-preferred mode, the beam currents of the beamlets are lower and the spot sizes of the beamlets are smaller, thus allowing a higher resolution of inspection results. For such a purpose, the aperture size of apertures 410 and 412 may be designed to be smaller than other apertures of the aperture array, such as apertures 404, 406, and 408.

It should be noted that the number of beamlets generated in FIG. 4B is determined by an output angle of the primary electron beam 202 and the pass-or-block statuses of apertures projected by primary electron beam 202. For example, in FIG. 4B, primary electron beam 202 may project and cover apertures 404-412. If both apertures 410 and 412 operate in the pass status, the number of generated beamlets is 2. If only one of apertures 410 and 412 operates in the pass status (e.g., only aperture 410 operates in the pass status), the number of generated beamlets is less than 2 (e.g., 1). Also, contrary to FIG. 4A, the upper limit of the number of the generated beamlets may not be limited by the output angle of primary electron beam 202. For example, by adjusting the first principal plane of condenser lens 210, primary electron beam 202 may project onto areas wider than what its output angle permits (e.g., 2). Thus, the upper limit of the number of the generated beamlets may be more (e.g., more than 2).

As example embodiments, FIGS. 4A-4B show that, by controlling projection area of primary electron beam 202 to adjust beam currents and controlling the pass-or-block statuses of apertures of different sizes at different locations on the aperture array to adjust spot sizes, the multi-beam system may switch in different operation modes adaptive to different demands of throughputs and resolutions of various applications. By using large apertures in the throughput-preferred mode, the beam currents may be maximally utilized to increase the throughput. That is, the aperture sizes to be used in the throughput-preferred mode may be designed to be of any size such that the aperture size is no longer a limiting factor of achieving high beam currents. By using only small apertures in the resolution-preferred mode, the beam currents may be effectively reduced to a level lower than the lowest beam currents allowed by the large apertures. That is, the aperture sizes in the throughput-preferred mode is no longer a limiting factor of achieving low beam currents. Such a design does not significantly increase complexity of the multi-beam system and provide users with more application options in a single solution without incurring significant costs.

As shown in FIGS. 4A-4B, source conversion unit 220 may include beam focusing, directing, or deflecting components that may cause beamlets 414, 416, and 418 (in FIG. 4A) or beamlets 420 and 422 (in FIG. 4B) to converge and cross a common area downstream from source conversion unit 220. It should be noted that FIGS. 4A-4B are mere diagrammatic illustrations for explaining principles and describing example embodiments of this disclosure, and the actual apparatus and system may include more, fewer, or exactly the same components as shown, or having configurations and arrangements of the components in the same or different way.

This disclosure proposes apparatuses and methods for multi-modal operations of the multi-beam system. In some embodiments, the apparatus may be implemented as one or more components being part of or associated with source conversion unit 220. For example, source conversion unit 220 may include an aperture array that includes a first group of apertures having a first size and a second group of apertures having a second size different from the first size. The first size of the first group of apertures may enable a first set of beamlets, each of which may be associated with a first beam current. The second size of the second group of apertures may enable a second set of beamlets, each of which may be associated with a second beam current different from the first beam current. In some embodiments, the second group of apertures may adjoin the first group of apertures (e.g., no portion of the second group of apertures is isolated by any portion of the first group of apertures). The first group of apertures and the second group of apertures may be configured to operate in the same pass-or-block status or different pass-or-block statuses. An aperture in a pass status may enable a beam to pass through the aperture, and the aperture in a block status may stop the beam from passing through the aperture. For example, the first and the second groups of apertures may be both in the pass status or both in the block status. For another example, one of the first and second groups of apertures may be in the pass status and the other one of the first and second groups may be in the block status. For another example, the first group of apertures, the second group of apertures, or both, may be further configured to operate in a third status different from the pass status or the block status. In the third status, the apertures may focus or bend the electron beam, among others. In some embodiments, the pass-or-block statuses of the apertures may be independently controlled by circuitry of source conversion unit 220. In some embodiments, the aperture array may be a micro-electromechanical systems (MEMS) aperture array. In some embodiments, the circuitry may be a processor (e.g., a processor of controller 109 of FIG. 1), a memory storing executable instructions (e.g., a memory of controller 109 of FIG. 1), or a combination thereof.

In some embodiments, the first size of the first group of apertures may be larger than the second size of the second group of apertures. For example, the first group of apertures may be used in a throughput-preferred mode of the multi-beam apparatus, in which larger aperture sizes and larger beam currents are preferred. The second group of apertures may be used in a resolution-preferred mode of the multi-beam apparatus, in which smaller spot sizes (and thus aperture sizes) and smaller beam currents are preferred. For example, as shown in FIGS. 4A-4B, the first group of apertures may include apertures 404, 406, and 408, and the second group of apertures may include apertures 410 and 412. In some embodiments, the second group of apertures may surround the first group of apertures. In some embodiments, the first group of apertures may be at a center of the aperture array.

By projecting a primary charged particle beam (e.g., primary electron beam 202) onto different groups of apertures that have different sizes, the multi-beam system may switch between different combinations of aperture sizes and beam currents, and thus operates in different modes for different applications that have different preferences in throughputs and inspection resolutions. For example, when the multi-beam inspection system is configured to operate in a first mode (e.g., the throughput-preferred mode), the primary charged particle beam may be projected onto the first group of apertures, and the first group of apertures may be configured to operate in the pass status and the second group of apertures may be configured to operate in the block status. For another example, when the multi-beam inspection system is configured to operate in a second mode (e.g., the resolution-preferred mode), the primary charged particle beam may be projected onto the second group of apertures, and the first group of apertures may be configured to operate in the block status and the second group of apertures may be configured to operate in the pass status. It should be noted that the projection area of the primary charged particle beam may not exactly covers a group (e.g., the first or second group) of apertures. Controlling the pass-or-block statuses of the apertures under different modes may ensure only the apertures having the selected size may be used for the corresponding mode, and no apertures having the non-selected size may be used, thereby preventing mistakes in controlling beam currents and spot sizes of the beamlets.

In some embodiments, the multi-beam system may work in more than two modes. For example, the multi-beam system may work in the throughput-preferred mode, the resolution-preferred mode, and a "balance mode" that prefers a balance between throughput and resolution. It should be noted that, the multi-beam system may work in any number of any modes. Correspondingly, the aperture array of the apparatus may include apertures of more than two sizes. For example, the aperture array may include a third group of apertures having a third size that is different from the first and second sizes. In some embodiments, the third size may be smaller than the second size. In some embodiments, the third group of apertures may adjoin the second group of apertures. In some embodiments, the third group of apertures may surround the second group of apertures.

Correspondingly, when the aperture array includes apertures of more than two sizes, and the multi-beam system is capable of working in more than two modes, different groups of apertures may be configured to operate in different pass-or-block statuses accordingly. In some embodiments, the pass-or-block statuses of the different groups of apertures may be independently controlled by the circuitry of source conversion unit 220. For example, when the aperture array includes the first, second, and third group of apertures, and the multi-beam inspection system is configured to operate in the first mode (e.g., the throughput-preferred mode), the first group of apertures may be configured to operate in the pass status, and the second and third groups of apertures may be configured to operate in the block status. When the multi-beam inspection system is configured to operate in the second mode (e.g., the balance mode), the second group of apertures may be configured to operate in the pass status, and the first and third groups of apertures may be configured to operate in the block status. When the multi-beam inspection system is configured to operate in a third mode (e.g., the resolution-preferred mode), the third group of apertures may be configured to operate in the pass status, and the first and second groups of apertures may be configured to operate in the block status.

The sizes, locations, and arrangements of the groups of apertures of the aperture array of the apparatus may be in any configuration as long as the primary charged particle beam may be controlled to project onto substantially one group in each operation mode of the multi-beam system. FIGS. 5A-5I are diagrammatic illustrations of example aperture arrays for generating beamlets, consistent with embodiments of the present disclosure. The aperture array may be used in source conversion unit 220 in FIG. 2 and FIGS. 4A-4B. In some embodiments, the aperture arrays shown in FIGS. 5A-5I may be MEMS aperture arrays.

FIG. 5A shows an example aperture array 500A that may be used in source conversion unit 220. Aperture array 500A includes two groups of apertures. The first group of apertures have a larger aperture size, including aperture 502. The second group of apertures have a smaller aperture size, including aperture 504. As shown in FIG. 5A, the second group of apertures surrounds the first group of apertures, and the first apertures may be at a center of the aperture array. When the multi-beam system works in the throughput-preferred mode, the primary charged particle beam may be controlled to project substantially onto the first group of apertures. Source conversion unit 220 may control the first group of apertures to operate in a pass status and the second group of apertures to be in a block status. Also, the beam currents of the primary charged particle beam may be increased. By doing so, the multi-beam system may achieve larger beam currents for increasing inspection throughput while keeping the capability of reaching the higher resolution under given beam currents—that is, a higher resolution achievable by the multi-beam system may reach the upper-right end of the high-resolution curve in FIG. 3. When the multi-beam system works in the resolution-preferred mode, the primary charged particle beam may be controlled to project onto the second group of apertures. The primary charged particle beam may also cover the first group of apertures in this case, but source conversion unit 220 may control the first group of apertures to be in the pass status and the second group of apertures to be in the block status. Also, the beam currents of the primary charged particle beam may be decreased. By doing so, the multi-beam system may achieve smaller beam currents for increasing inspection resolution beyond the highest resolution achievable when using the first group of apertures—that is, the resolution achievable by the multi-beam system may reach the lower-left end of the high-resolution curve in FIG. 3.

Figure 5C:
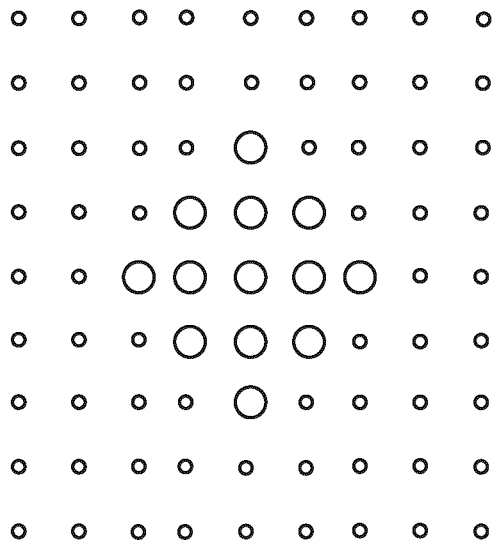

It should be noted that the number, locations, sizes, center-to-center distances ("pitches") of apertures in each group may be different from what aperture array 500A shows. FIGS. 5B-5C show example aperture arrays 500B and 500C, respectively, which includes two groups of apertures having two sizes, similar to the first and second group of apertures in aperture array 500A of FIG. 5A. The first group of apertures of aperture array 500B, which have a larger size and are surrounded by the second group of apertures, have more numbers of apertures than the first group in aperture array 500A of FIG. 5A. The first group of apertures of aperture array 500C, which have a larger size and are surrounded by the second group of apertures, are arranged in a diamond shape rather than the rectangle arrangement in aperture array 500A of FIG. 5A.

Figure 5E:
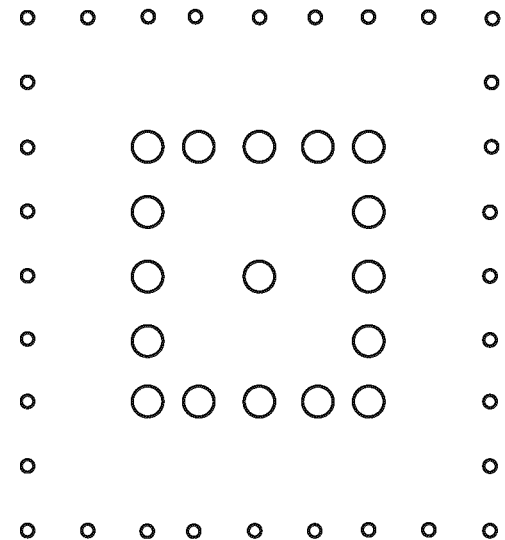
Figure 5B:
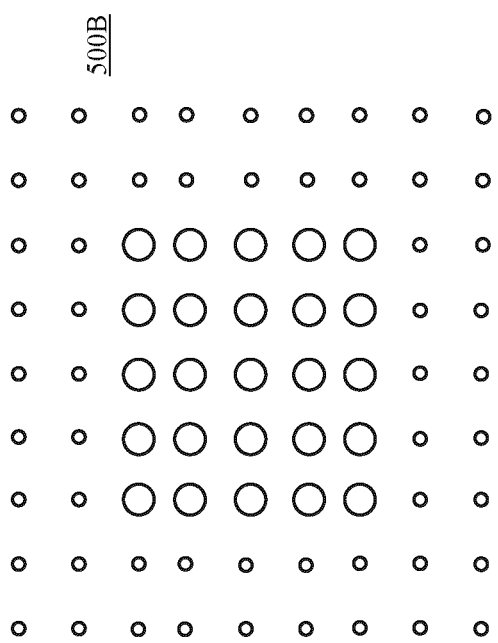
Figure 5D:
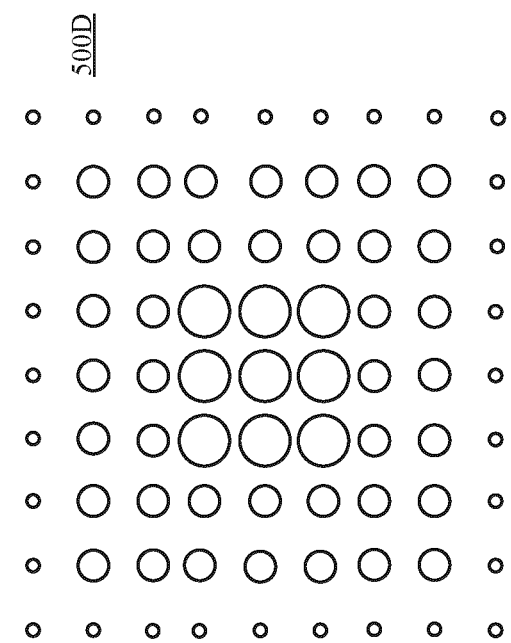
Figure 5G:
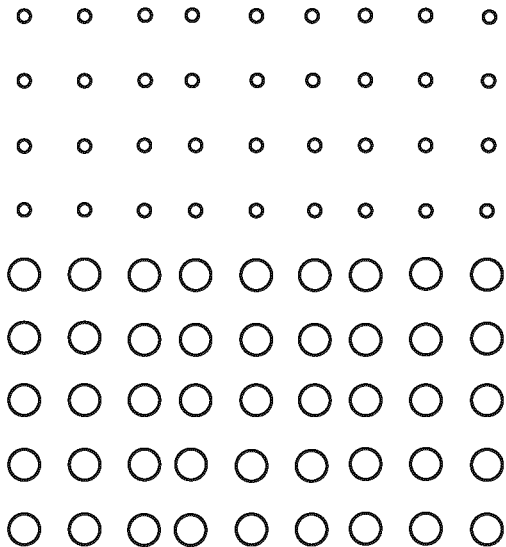
Figure 5I:
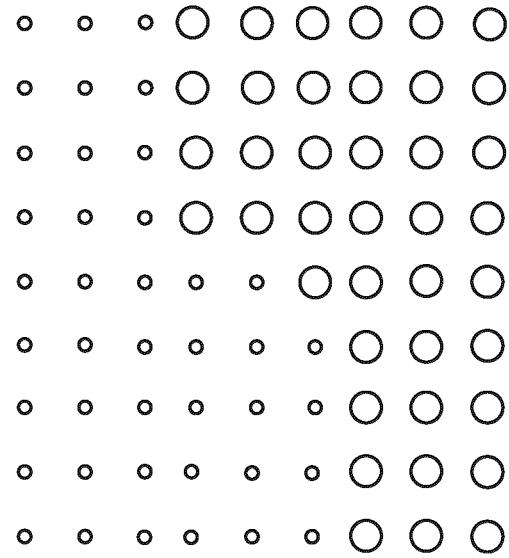
Figure 5F:
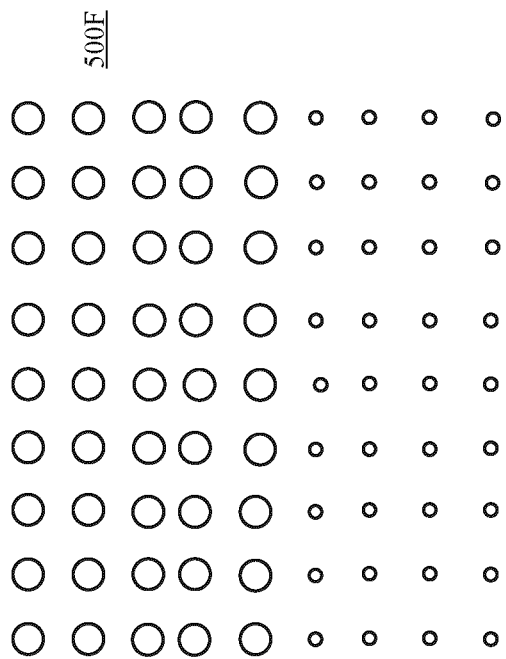
Figure 5H:
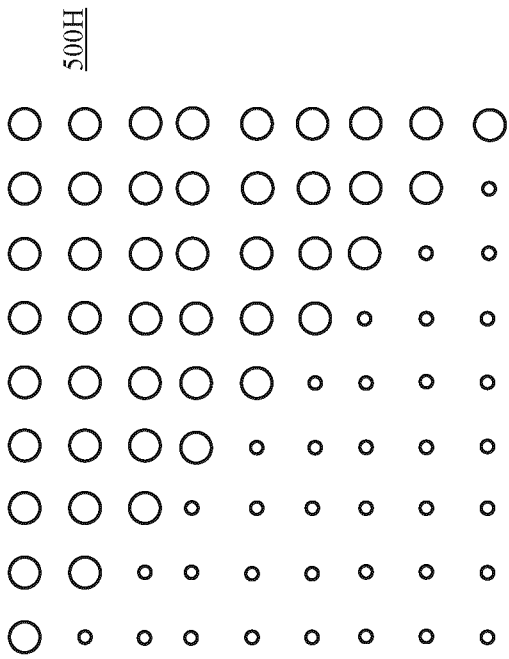

FIG. 5D shows an example aperture array 500D that includes a first, a second, and a third groups of apertures having the largest, the intermediate, and the smallest sizes, respectively. The second group of apertures surrounds the first group of apertures and are surrounded by the third group of apertures.

FIG. 5E shows an example aperture array 500E that includes two groups of apertures having two sizes, similar to the first and second group of apertures in aperture array 500B of FIG. 5B. The first group of apertures in FIG. 5E have a larger size and are surrounded by the second group of apertures, and the pitches of the apertures in aperture array 500E are larger than the pitches of apertures of aperture array 500B of FIG. 5B.

FIGS. 5F-5I show example aperture arrays 500F, 500G, 500H, and 500I, respectively, each of which includes two groups of apertures having two sizes, similar to the first and second group of apertures in aperture array 500A of FIG. 5A. The first group of apertures of aperture arrays 500F and 500G, which have a larger size and located at the upper and left portions of aperture array 500F and 500G, respectively, adjoin the second group of apertures without being surrounded thereby. The first group of apertures of aperture array 500H, which have a larger size and located at the upper-right portion of aperture array 500H, adjoin the second group of apertures by a diagonal line of aperture array. The first group of apertures of aperture array 500I, which have a larger size and substantially located at the lower portion of aperture array 500I, adjoin the second group of apertures by an irregular line of aperture array.

It should be noted that more example embodiments of aperture arrays are possible, which are not limited by examples of presented in this disclosure.

To control projecting the primary charged particle beam onto a group of apertures of the aperture array in the proposed apparatus, various methods may be used. Those methods may depend on the configurations of the apertures in the aperture array.

In some embodiments, when different groups of apertures adjoin one another in a closed line (e.g., surrounding one another as shown in FIGS. 5A-5E), the projection area of the primary charged particle beam may be controlled via adjusting its projection areas, as shown and described in FIGS. 4A-4B.

Using aperture array 500A of FIG. 5A as an example, when the multi-beam system works in a throughput-preferred mode, as shown in FIG. 4A, the first principal plane of the adjustable condenser lens 210 may be adjusted to be close to electron source 201 to decrease the projection area of primary electron beam 202. Primary electron beam 202 may be projected onto at least the first group of apertures in aperture array 500A (e.g., including apertures 404, 406, and 408 in FIG. 4A, or including aperture 502 in FIG. 5A). For example, a condenser system (e.g., condenser lens 210) may be configured to set the projection area to be a first projection area covering at least the first group of apertures. Also, the apparatus (e.g., circuitry of the apparatus) may be configured to control the first group of apertures to be in the pass status and the second group of apertures to be in the block status, such that primary electron beam 202 may pass through the first group of apertures to form beamlets and be blocked by the second group of apertures.

In the same example using aperture array 500A, when the multi-beam system works in a resolution-preferred mode, as shown in FIG. 4B, the first principal plane of the adjustable condenser lens 210 may be adjusted away from electron source 201 to increase the projection area of primary electron beam 202. Primary electron beam 202 may be projected on the first and second groups of apertures in aperture array 500A (e.g., including apertures 404-412 in FIG. 4B, or including apertures 502 and 504 in FIG. 5A). For example, the condenser system may be configured to set the projection area to be a second projection area larger than the first projection area, in which the second projection area covers at least the second group of apertures. Also, the apparatus (e.g., the circuitry of the apparatus) may be configured to control the first group of apertures to be in the block status and the second group of apertures to be in the pass status, such that primary electron beam 202 may pass through the second group of apertures to form beamlets and be blocked by the first group of apertures.

In some embodiments, when different groups of apertures adjoin one another in an open line (e.g., as shown in FIGS. 5F-5I), the projection area of the primary charged particle beam may be controlled via deflecting or directing its projection direction, such as by using a deflector (not shown). It should be noted that the methods for directing the primary charged particle beam to project on different groups of apertures of different aperture sizes in the aperture array are not limited to the example embodiments shown and described herein, and other methods and devices may be used.

Figure 6:
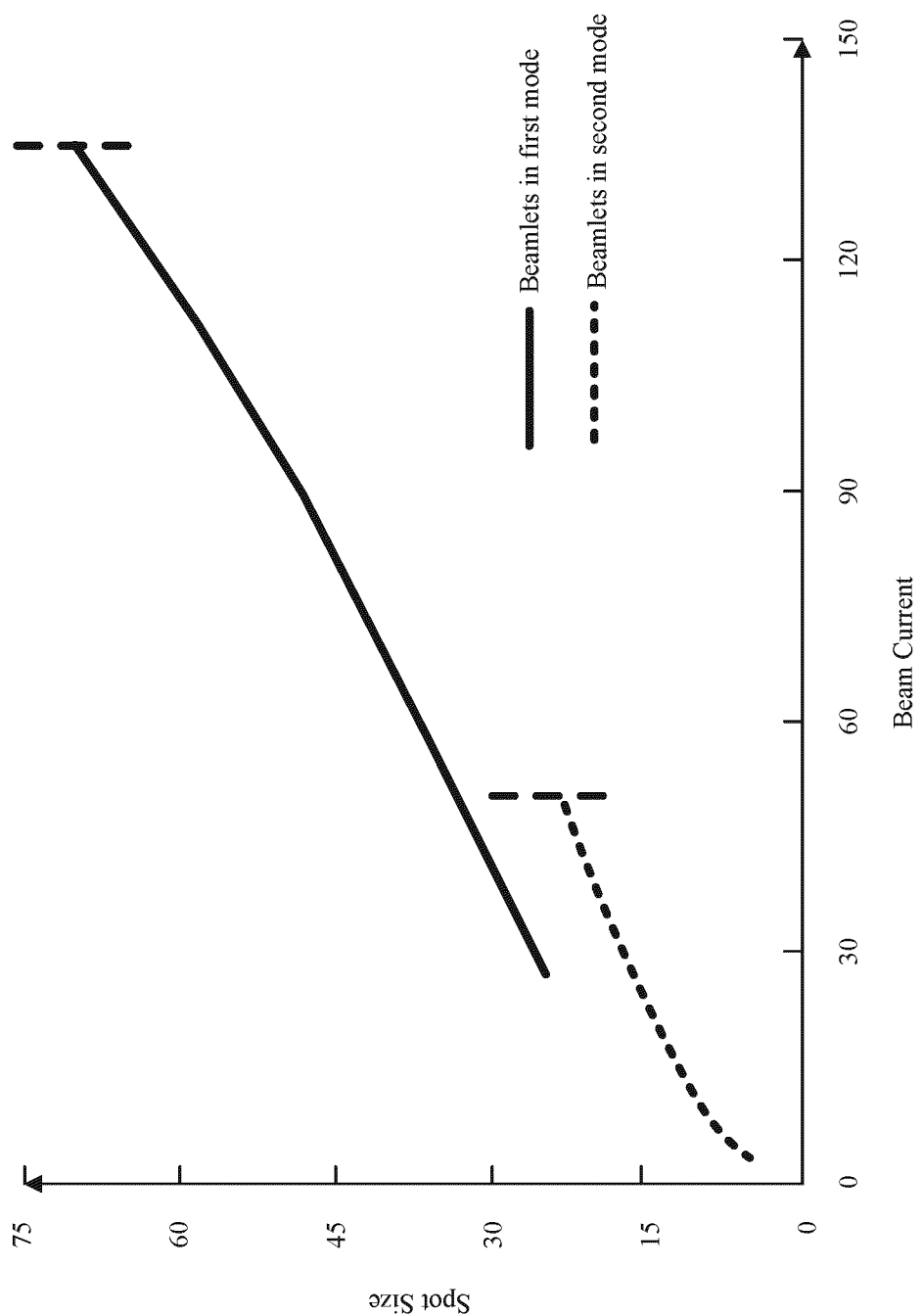
FIG. 6 is a diagrammatic illustration of example spot sizes and currents of a beamlet supported by a multi-beam system capable of multi-modal operations, consistent with embodiments of the present disclosure.

FIG. 6 is a diagrammatic illustration of example spot sizes and currents of a beamlet supported by a multi-beam system capable of multi-modal operations, consistent with embodiments of the present disclosure. For example, the multi-beam system may be equipped with aperture array 500A as shown in FIG. 5A. In FIG. 6, the horizontal axis indicates beam currents of a generated beamlet, and the vertical axis indicates the spot sizes of the beamlet. The solid and dotted line may represent ranges of spot sizes and beam currents of the beamlets generated in the first mode (e.g., throughput-preferred mode) and the second mode (e.g., resolution-preferred mode) of the multi-beam system, respectively. For example, the solid and dotted line may correspond to the beamlets generated using the first and second groups of apertures of aperture array 500A of FIG. 5A, respectively. Compared with multi-beam system that is only equipped with apertures having a single size, the proposed multi-beam system may extend the ranges of spot sizes and beam currents that it may provide.

The solid and dotted line in FIG. 6 have cutoffs at the right end, indicated by vertical dashed lines. Those cutoffs are referred to as "source uniform half angle limit," and represent upper limits on the beam currents that the multi-beam system may provide under each mode due to the limit of source uniform half angle. As shown in FIGS. 4A-4B, a source may emit charged particles in a cone shape ("charged particle cone"). To ensure uniform inspection results, only the uniform part of the charged particle cone may be used to form the primary charged particle beam and further form the beamlets. The range of the uniform part of the charged particle cone may be indicated by a "source uniform half angle." As the emission power of the source increases, the beam current may increase, and the source uniform half angle may hit its maximum range, thereby limiting the maximum beam current that may be provided. Compared with conventional multi-beam system, embodiments of this disclosure may push the upper limit of the beam currents to a higher source uniform half angle limit by providing capability of switching to use a larger size of apertures during inspection.

Figure 7:
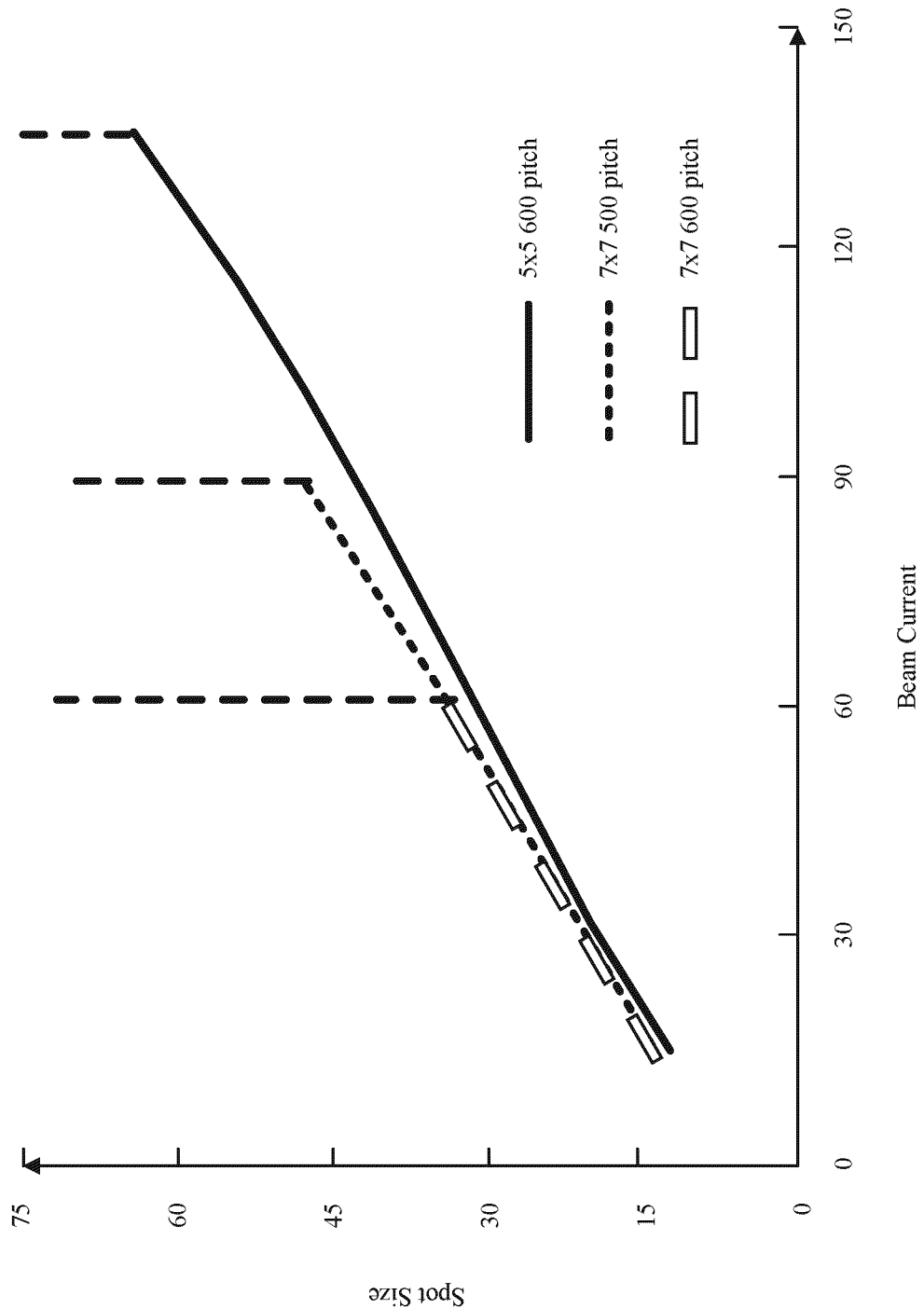
FIG. 7 is a diagrammatic illustration of example spot sizes and currents of a beamlet supported by aperture arrays of different sizes and pitches, consistent with embodiments of the present disclosure.

Aperture arrays of different sizes and pitches may have different source uniform half angle limits. FIG. 7 is a diagrammatic illustration of example spot sizes and currents of a beamlet supported by aperture arrays of different sizes and pitches, consistent with embodiments of the present disclosure. For ease of illustration without causing ambiguity, FIG. 7 only shows the spot sizes and currents of a beamlet supported by a multi-beam system in the first mode (e.g., throughput-preferred mode). FIG. 7 shows two sizes of pitches (i.e., sizes 500 and 600), in which the number values are proportional to the sizes of the pitches. That is, a larger number may represent a larger pitch, and a smaller number may represent a smaller pitch. In FIG. 7, the solid line corresponds to an aperture array that has 5×5 apertures with a 600 pitch. The dotted line corresponds to an aperture array that has 7×7 apertures with a 500 pitch. The hollow dashed line corresponds to an aperture array that has 7×7 apertures with a 600 pitch. The source uniform half angle limits are indicated by vertical dashed lines. The aperture array having 5×5 apertures with a 600 pitch may be a square having an overall size of 2400×2400 (2400=600×4). Similarly, the aperture array having 7×7 apertures with a 500 pitch may have an overall size of 3000×3000. The aperture array that has 7×7 apertures with a 600 pitch may have an overall size of 1.8×1.8 mm². As shown in FIG. 7, as the overall size of the aperture array increases, the source uniform half angle limits may decrease. Embodiments of this disclosure may further provide various overall sizes, pitches, and numbers of the aperture array, thus providing capability of various source uniform half angle limits for different applications.

Figure 8:
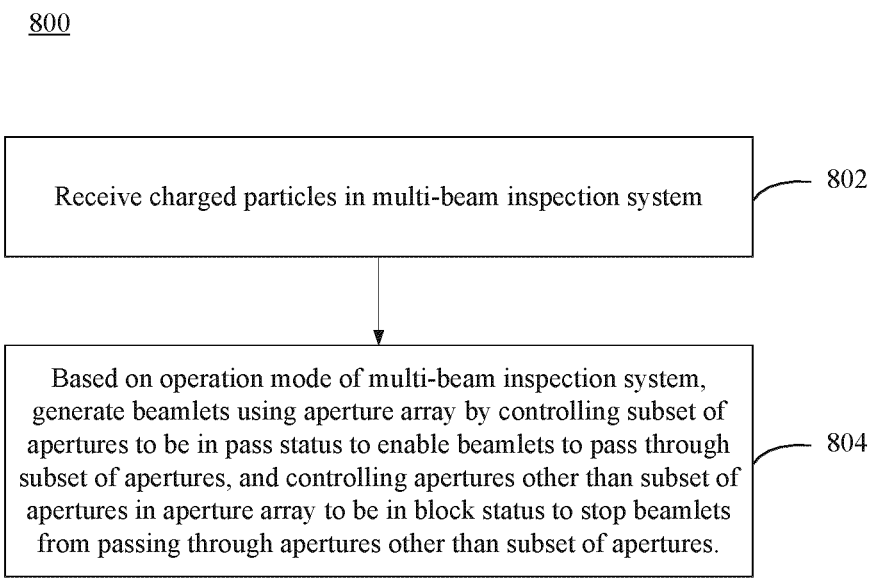
FIG. 8 is a flowchart illustrating an exemplary method of multi-modal operations for a multi-beam inspection system, consistent with embodiments of the present disclosure.

FIG. 8 is a flowchart illustrating an exemplary method 800 of multi-modal operations for a multi-beam inspection system, consistent with embodiments of the present disclosure. Method 800 may be performed by a beamlet generation module of the multi-beam inspection system (e.g., EBI system 100). For example, the beamlet generation module may be source conversion unit 220 in FIG. 2. A controller of the beamlet generation module may be programmed to implement method 800. For example, the controller may be an internal controller or an external controller (e.g., controller 109 in FIGS. 1-2) coupled with the beamlet generation module. Method 800 may be connected to the operations and steps as shown and described in FIGS. 3-7.

At step 802, the multi-beam inspection system may receive charged particles in the multi-beam inspection system. For example, the charged particles may be emitted from a source (e.g., source 201 in FIG. 2 or FIGS. 4A-4B).

At step 804, based on an operation mode, the multi-beam inspection system may generate beamlets using an aperture array. The multi-beam inspection system (e.g., the controller) may control the subset of apertures to operate in a pass status to enable beamlets to pass through the subset of apertures, and control apertures other than the subset of apertures in the aperture array to be in a block status to stop beamlets from passing through the apertures other than the subset of apertures. For example, the aperture array may be any of aperture arrays 500A-500I.

For example, the aperture array may include a first subset of apertures having a first size and a second subset of apertures having a second size different from the first size. The first size may be larger than the second size. In some embodiments, the second subset of apertures may adjoin the first subset of apertures, such as the second and first groups of apertures shown in FIGS. 5A-5I, respectively. In some embodiments, the second subset of apertures may surround the first subset of apertures, such as the second and first groups of apertures shown in FIGS. 5A-5E, respectively. In some embodiments, the first subset of apertures may be at a center of the aperture array, such as the first groups of apertures shown in FIGS. 5A-5E.

In some embodiments, the aperture array may include apertures having more than two sizes. For example, the aperture array may include a third subset of apertures having a third size smaller than the second size. The second size may be smaller than the first size. In some embodiments, the third subset of apertures may adjoin the second subset of apertures. In some embodiments, the third subset of apertures may surround the second subset of apertures, in which the second subset of apertures may surround the first subset of apertures, such as the third, second, and first groups of apertures shown in FIG. 5D, respectively.

In some embodiments, the multi-beam inspection system may control a condenser system to set a projection area of the charged particles to cover the subset of apertures. For example, as shown and described in FIGS. 4A-4B, the multi-beam inspection system may move the first principal plane of condenser lens 210 towards or away from source 201 to set the projection area.

The multi-beam inspection system may operate in different modes. Using aperture array 500A of FIG. 5A as an example, when the multi-beam inspection system is configured to operate in a first operation mode (e.g., a throughput-preferred mode), the multi-beam inspection system may control (e.g., using condenser lens 210 in FIG. 4A) the projection area to be a first projection area covering at least the first subset of apertures. For example, the first subset of apertures may include aperture 502 in FIG. 5 or apertures 404, 406, and 408 in FIGS. 4A-4B. The multi-beam inspection system may further control the first subset of apertures to be in the pass status and the second subset of apertures to be in the block status. For example, the second subset of apertures may include aperture 504 in FIG. 5 or apertures 410 and 412 in FIGS. 4A-4B. When the multi-beam inspection system is configured to operate in a second operation mode (e.g., a resolution-preferred mode), the multi-beam inspection system may control (e.g., using condenser lens 210 as shown and described in FIG. 4B) the projection area to be a second projection area covering at least the second subset of apertures. The multi-beam inspection system may further control the first subset of apertures to be in the block status and the second subset of apertures to be in the pass status. For example, the second projection area may be larger than the first projection area, such as enclosing the entire first projection area, as shown and described in FIGS. 4A-4B.

In some embodiments, when the aperture array includes apertures having more than two sizes, the multi-beam inspection system may operate in more than two different modes. For example, the aperture array may include the first, second, and third subsets of apertures (e.g., as shown in FIG. 5D).

When the multi-beam inspection system is configured to operate in the first mode (e.g., the throughput-preferred mode), the multi-beam inspection system may control the projection area to be the first projection area, and control the first subset of apertures to be in the pass status and the second and third subsets of apertures to be in the block status. When the multi-beam inspection system is configured to operate in the second mode (e.g., a balance mode as previously described), the multi-beam inspection system may control the projection area to be the second projection area, and control the second subset of apertures to be in the pass status and the first and third subsets of apertures to be in the block status. When the multi-beam inspection system is configured to operate in a third mode (e.g., the resolution-preferred mode), the multi-beam inspection system may control the projection area to be a third projection area covering at least the third subset of apertures, and control the third subset of apertures to be in the pass status and the first and second subsets of apertures to be in the block status. In some embodiments, the third projection area may be larger than the second projection area, in which the second projection area may be larger than the first projection area, such as shown in FIG. 5D.

In some embodiments, if the second subset of apertures (having a smaller aperture size) surround the first subset of apertures (having a larger aperture size), such as aperture array 500A of FIG. 5A, when the multi-beam inspection system works in the resolution-preferred mode, the probe spot of the beamlets may have an uncovering portion (a "gap") at the center. To ensure a complete scan of a scanning area with the probe spot having the gap, one way to perform the inspection is to scan the scanning area multiple times, and in each time the probe spot may shift to use its covering portions to scan the un-scanned area due to the gap. In this manner, some sub-areas of the scanning area may be scanned for more times than other sub-areas thereof.

In some embodiments, to save time for scanning and to ensure that each sub-area of the scanning area is scanned for the same amount of times, the multi-beam inspection system may scan a surface of a sample using the beamlets in a predetermined scanning pattern. Following the scanning pattern, each sub-area of a scanning area of the beamlets may be scanned for the same amount of times.

Figure 9A:
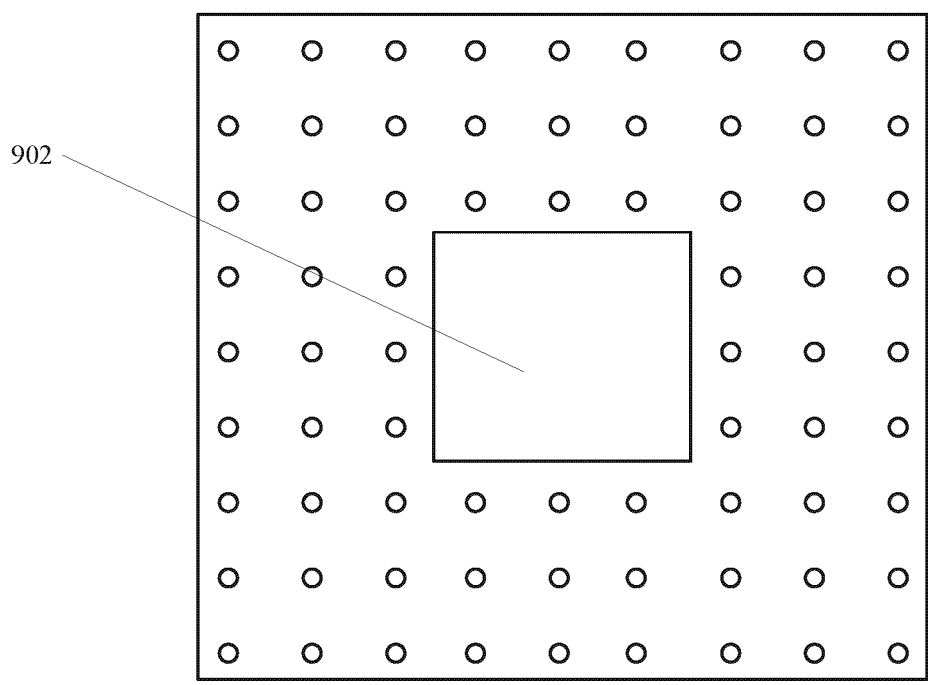
FIG. 9A is a diagrammatic illustration of an example probe spot of beamlets in the second operation mode of the multi-beam system, consistent with embodiments of the present disclosure.
Figure 9B:
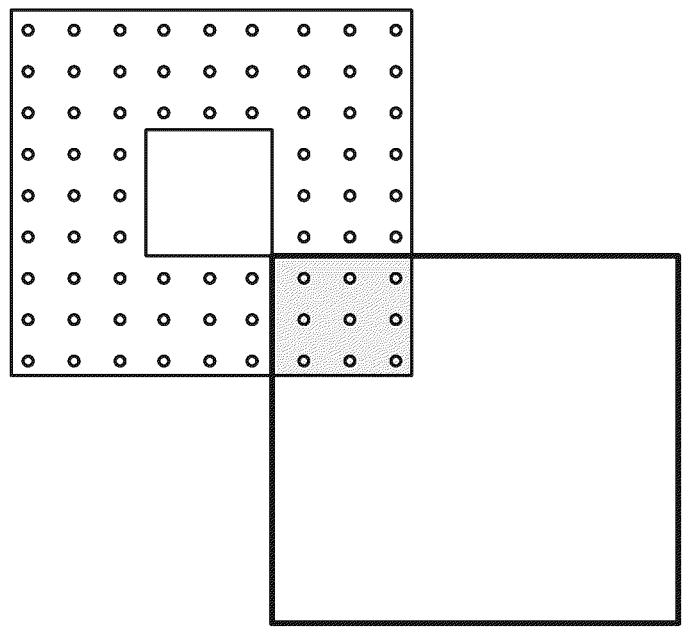
FIGS. 9B-9E show a diagrammatic illustration of an example scanning path for the beamlets in FIG. 9A, consistent with embodiments of the present disclosure.
Figure 9B:
Figure 9B:
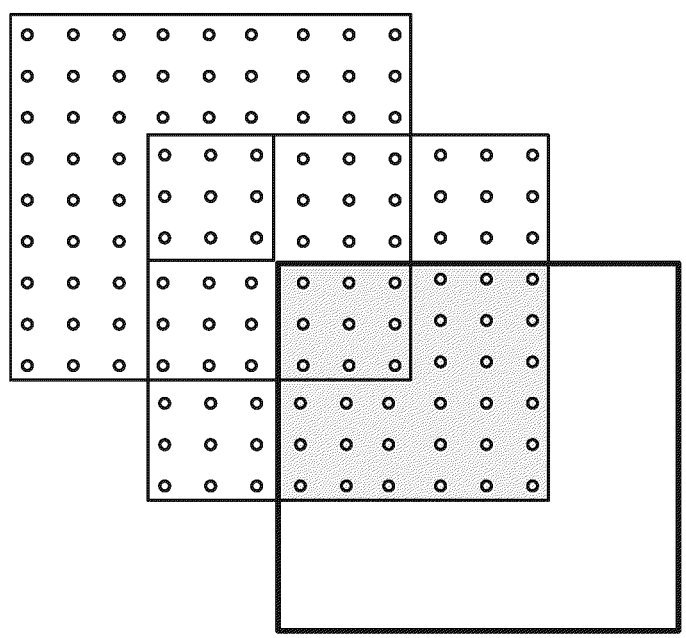
Figure 9B:
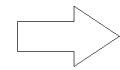
Figure 9C:
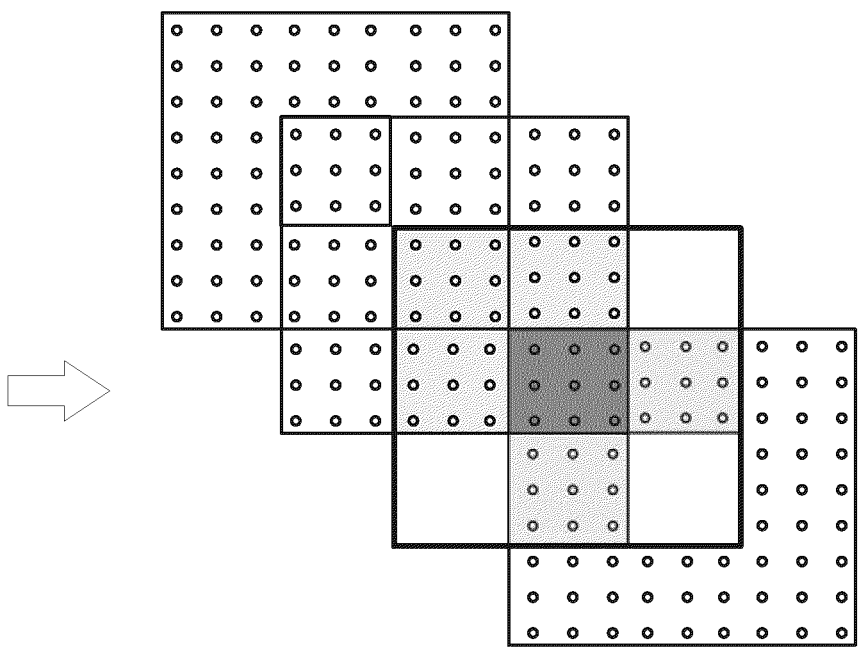
Figure 9C:
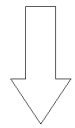
Figure 9C:
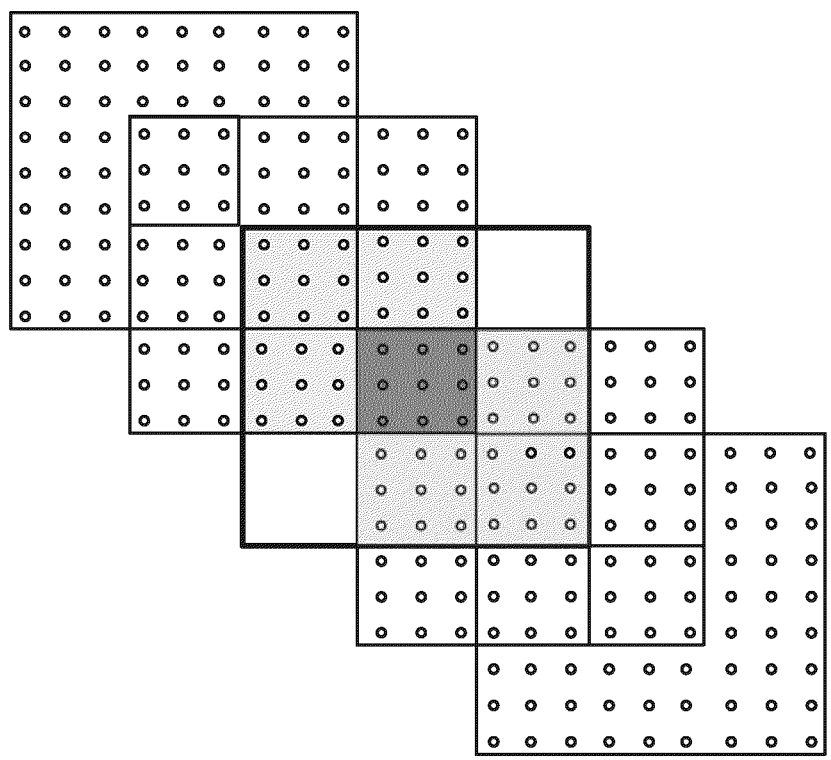
Figure 9C:
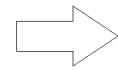
Figure 9D:
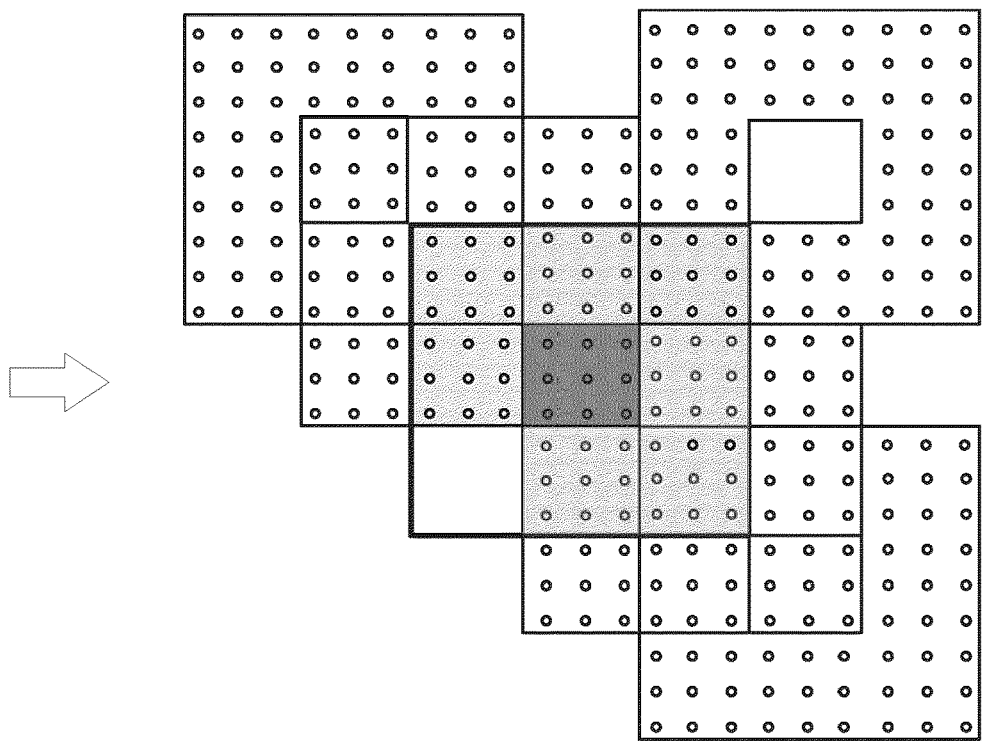
Figure 9D:
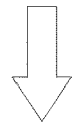
Figure 9D:
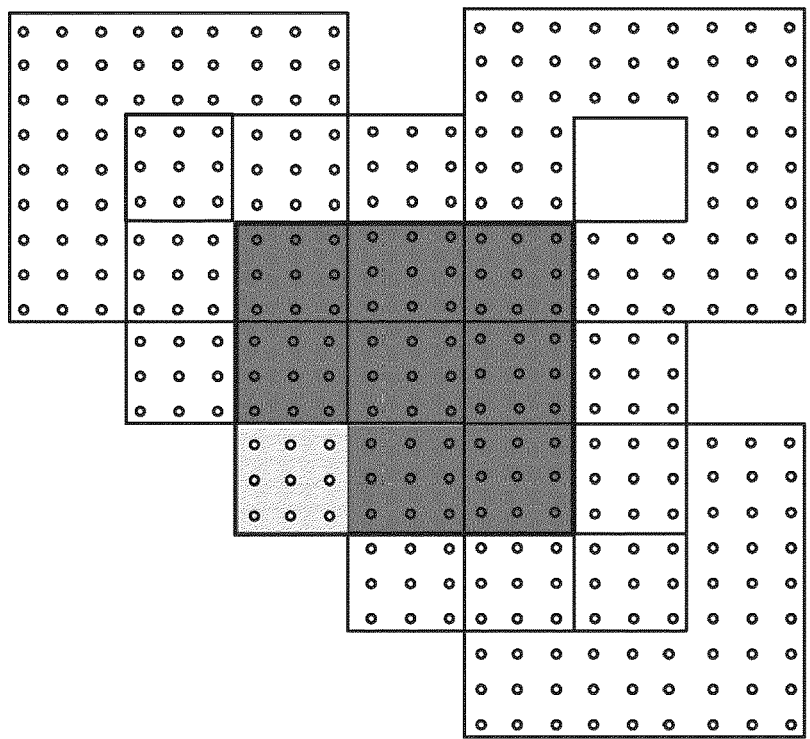
Figure 9D:
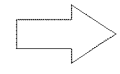
Figure 9E:
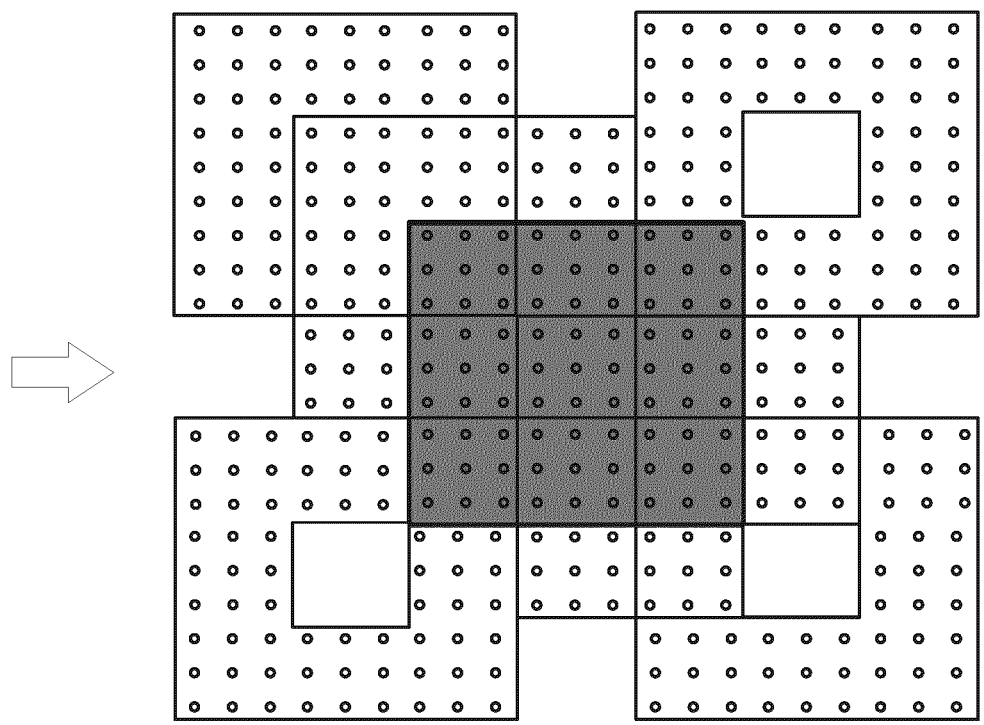

FIG. 9A is a diagrammatic illustration of an example probe spot of beamlets in the second operation mode of the multi-beam system, consistent with embodiments of the present disclosure. As shown in FIG. 9A, each circle may represent a probe spot of a single beamlet, and the solid line may represent the boundaries of the probe spots of the beamlets (e.g., generated using aperture array 500A of FIG. 5A) in the second operation mode (e.g., the resolution-preferred mode of FIG. 4B). The probe spots of the beamlets has a gap 902 at the center.

FIGS. 9B-9E shows a diagrammatic illustration of an example scanning path for the beamlets in FIG. 9A, consistent with embodiments of the present disclosure. In FIGS. 9B-9E, the square enclosed by a bold line indicate the scanning area that is to be inspected. The scanning area may be divided into multiple sub-areas (e.g., 9 sub-areas in FIGS. 9B-9E). The hollow arrows connect individual steps of the scanning path. At each step, the probe spots of the beamlet having a gap at the center may be projected to cover a different portion of the scanning area, each portion including one or more of the sub-areas. It should be noted that the beamlets may perform the inspection following the scanning path in either a stepper ("leap scan") manner or a continuous scanning manner.

Following the scanning path in FIGS. 9B-9E, each sub-area may be scanned for twice. When a sub-area is scanned for the first time, it is shown in a light shade. When the sub-area is scanned for the second time, it is shown in a dark shade. It should be noted that the scanning path shown in FIGS. 9B-9E is just one example embodiment, and other embodiments of the scanning path may be used. For example, the order of scanning the sub-areas in FIGS. 9B-9E may be rearranged to achieve the same results. It should also be noted that the sub-areas of the scanning area may be scanned for more than twice, as long as they are scanned for the same amount of times, which is not limited by this disclosure.

When the multi-beam inspection system completes scanning each sub-area of a first scanning area for the same amount of times, it may proceed to scan a second scanning area. For each sub-area of the first scanning area, the detected signals collected from each scan may be processed (e.g., averaged or averaged with weights), and an inspection image of the first scanning area may be generated by synthesizing the processed detected signals of all its sub-areas. By doing so, the inspection image may be generated with higher uniformity, and the resolution of the inspection image may be further improved, which is consistent with the goal of the resolution-preferred mode of the multi-beam inspection system. That is, in the resolution-preferred mode, the multi-beam inspection system not only may provide smaller spot sizes and lower beam currents for improving resolution of inspection images, but also may further improve the resolution by performing multiple scans for the scanning area.

The embodiments may further be described using the following clauses:

1. An apparatus comprising:
   an aperture array comprising:
      a first group of apertures having a first size, and
      a second group of apertures having a second size different from the first size; and
   wherein the first group of apertures and the second group of apertures are configured to operate in different pass-or-block statuses, and wherein an aperture in a pass status enables a beam to pass through the aperture, and the aperture in a block status stops the beam from passing through the aperture.
2. The apparatus of clause 1, wherein the aperture array is a micro-electromechanical systems aperture array.
3. The apparatus of any of preceding clauses, wherein the first size of the first group of apertures is larger than the second size of the second group of apertures.
4. The apparatus of any of preceding clauses, wherein the second group of apertures surrounds the first group of apertures.
5. The apparatus of any of preceding clauses, wherein the first group of apertures is at a center of the aperture array.
6. The apparatus of any of preceding clauses, wherein when the multi-beam inspection system is configured to operate in a first mode, the first group of apertures are configured to operate in the pass status, and the second group of apertures are configured to operate in the block status.
7. The apparatus of any of preceding clauses, wherein when the multi-beam inspection system is configured to operate in a second mode, the first group of apertures are configured to operate in the block status, and the second group of apertures are configured to operate in the pass status.
8. The apparatus of any of preceding clauses, wherein the aperture array comprises a third group of apertures having a third size smaller than the second size.
9. The apparatus of clause 8, wherein the third group of apertures surrounds the second group of apertures.
10. The apparatus of any of clauses 8-9, wherein when the multi-beam inspection system is configured to operate in the first mode, the first group of apertures are configured to operate in the pass status, and the second group of apertures and the third group of apertures are configured to operate in the block status,
    when the multi-beam inspection system is configured to operate in the second mode, the second group of apertures are configured to operate in the pass status, and the first group of apertures and the third group of apertures are configured to operate in the block status, and
    when the multi-beam inspection system is configured to operate in a third mode, the third group of apertures are configured to operate in the pass status, and the first group of apertures and the second group of apertures are configured to operate in the block status.
11. A multi-beam apparatus of multi-modal inspection operations, the multi-beam apparatus comprising:
    a source configured to emit charged particles;
    a condenser system configured to set a projection area of the charged particles;
    an aperture array configured to generate beamlets from the charged particles in the projection area, comprising a first group of apertures having a first size and a second group of apertures having a second size different from the first size; and
    circuitry for controlling the first group of apertures and the second group of apertures to be in different pass-or-block statuses, wherein a pass status of an aperture enables a beam to pass through the aperture, and a block status of the aperture stops the beam from passing through the aperture.
12. The multi-beam apparatus of clause 10, wherein the aperture array is a micro-electromechanical systems aperture array.
13. The multi-beam apparatus of any of clauses 11-13, wherein the second group of apertures surrounds the first group of apertures.
14. The multi-beam apparatus of any of clauses 11-14, wherein the first group of apertures is at a center of the aperture array.
15. The multi-beam apparatus of any of clauses 11-14, wherein the multi-beam apparatus operates in a first mode, and wherein
    the condenser system is configured to set the projection area to be a first projection area covering at least the first group of apertures, and
    the circuitry is configured to control the first group of apertures to be in the pass status and the second group of apertures to be in the block status.
16. The multi-beam apparatus of any of clauses 11-15, wherein the first size of the first group of apertures is larger than the second size of the second group of apertures.
17. The multi-beam apparatus of clause 16, wherein the multi-beam apparatus operates in a second mode, and wherein
    the condenser system is configured to set the projection area to be a second projection area covering at least the second group of apertures, and
    the circuitry is configured to control the first group of apertures to be in the block status and the second group of apertures to be in the pass status.
18. The multi-beam apparatus of clause 17, wherein the second projection area is larger than the first projection area.
19. The multi-beam apparatus of any of clauses 11-18, wherein the aperture array comprises a third group of apertures having a third size smaller than the second size.
20. The multi-beam apparatus of clause 19, wherein the third group of apertures surrounds the second group of apertures.
21. The multi-beam apparatus of any of clauses 19-20, wherein
    when the multi-beam apparatus is configured to operate in the first mode, the condenser system is configured to set the projection area to be the first projection area, and the circuitry controls the first group of apertures to be in the pass status and the second group of apertures and the third group of apertures to be in the block status,
    when the multi-beam apparatus is configured to operate in the second mode, the condenser system is configured to set the projection area to be the second projection area, and the circuitry controls the second group of apertures to be in the pass status and the first group of apertures and the third group of apertures to be in the block status, and when the multi-beam apparatus is configured to operate in a third mode, the condenser system is configured to set the projection area to be a third projection area covering at least the third group of apertures, and the circuitry controls the third group of apertures to be in the pass status and the first group of apertures and the second group of apertures to be in the block status.

22. The multi-beam apparatus of clause 21, wherein the third projection area is larger than the second projection area.

23. The multi-beam apparatus of any of clauses 11-22, wherein the charged particles are electrons.

24. A method for multi-modal operations of a multi-beam inspection system, the method comprising:
receiving charged particles in the multi-beam inspection system; and
based on an operation mode of the multi-beam inspection system, generating beamlets using an aperture array by controlling the subset of apertures to be in a pass status to enable beamlets to pass through the subset of apertures, and controlling apertures other than the subset of apertures in the aperture array to be in a block status to stop beamlets from passing through the apertures other than the subset of apertures.

25. The method of clause 24, further comprising:
controlling a condenser system to set a projection area of the charged particles to cover the subset of apertures.

26. The method of any of clauses 24-25, wherein the aperture array comprises a first subset of apertures having a first size and a second subset of apertures having a second size different from the first size.

27. The method of clause 26, wherein the second subset of apertures surrounds the first subset of apertures.

28. The method of any of clauses 26-27, wherein the first subset of apertures is at a center of the aperture array.

29. The method of any of clauses 26-28, wherein the first size of the first subset of apertures is larger than the second size of the second subset of apertures.

30. The method of any of clauses 26-29, wherein generating the beamlets comprises:
when the multi-beam inspection system is configured to operate in a first operation mode, controlling the projection area to be a first projection area covering at least the first subset of apertures, and
controlling the first subset of apertures to be in the pass status and the second subset of apertures to be in the block status.

31. The method of any of clauses 26-29, wherein generating the beamlets comprises:
when the multi-beam inspection system is configured to operate in a second operation mode, controlling the projection area to be a second projection area covering at least the second subset of apertures, and
controlling the first subset of apertures to be in the block status and the second subset of apertures to be in the pass status.

32. The method of clause 31, wherein the second projection area is larger than the first projection area.

33. The method of any of clauses 31-34, further comprising:
scanning a surface of a sample using the beamlets in a predetermined scanning pattern, wherein each sub-area of a scanning area of the beamlets is scanned for the same amount of times.

34. The method of any of clauses 24-33, wherein the aperture array further comprises a third subset of apertures having a third size smaller than the second size.

35. The method of clause 34, wherein the third subset of apertures surrounds the second subset of apertures.

36. The method of any of clauses 34-35, wherein generating the beamlets comprises:
when the multi-beam inspection system is configured to operate in the first mode, controlling the projection area to be the first projection area, and controlling the first subset of apertures to be in the pass status and the second subset of apertures and the third subset of apertures to be in the block status;
when the multi-beam inspection system is configured to operate in the second mode, controlling the projection area to be the second projection area, and controlling the second subset of apertures to be in the pass status and the first subset of apertures and the third subset of apertures to be in the pass status; and
when the multi-beam inspection system is configured to operate in a third mode, controlling the projection area to be a third projection area covering at least the third subset of apertures, and controlling the third subset of apertures to be in the pass status and the first and second subset of apertures and the second subset of apertures to be in the block status.

37. The method of clause 36, wherein the third projection area is larger than the second projection area.

38. The method of any of clauses 24-37, wherein the charged particles are electrons.

39. A non-transitory computer-readable medium that stores a set of instructions that is executable by at least one processor of an apparatus to cause the apparatus to perform a method for multi-modal operations of a multi-beam inspection system, the method comprising:
selecting an operation mode of the multi-beam inspection system; and
based on the selected operation mode of the multi-beam inspection system, generating beamlets using an aperture array by controlling a first set of apertures of the aperture array to operate in a pass status to enable beamlets to pass through the first set of apertures and controlling a second set of apertures of the aperture array to operate in a block status to stop beamlets from passing through the second set of apertures.

40. An apparatus comprising:
an aperture array comprising:
a first group of apertures having a first size to enable a first set of beamlets each with a first beam current, and
a second group of apertures having a second size to enable a second set of beamlets each with a second beam current, the first and second beam currents being different currents and the first size and the second size being different sizes;
wherein the first group of apertures and the second group of apertures are configured to operate in a pass status or a block status, wherein a selected aperture in the pass status enables a selected beam to pass through the selected aperture, and wherein the selected aperture in the block status prevents the selected beam from passing through the selected aperture.

41. The apparatus of clause 40, wherein both the first and the second groups of apertures are in one of the pass status or the block status.

42. The apparatus of clause 40, wherein one of the first and second groups of apertures is in the pass status and the other one of the first and second groups is in the block status.

43. The apparatus of clause 40, wherein the first group of apertures and the second group of apertures are further configured to operate in a third status different from the pass status or the block status.

44. The apparatus of any of clauses 40-43, wherein the beamlets are charged-particle beams.

45. The apparatus of clause 44, wherein the charged particles are electrons.

46. The apparatus of any of clauses 40-45, wherein the aperture array is a micro-electromechanical systems aperture array.

47. The apparatus of any of clauses 40-46, wherein the first size of the first group of apertures is larger than the second size of the second group of apertures.

48. The apparatus of any of clauses 40-47, wherein the second group of apertures surrounds the first group of apertures.

49. The apparatus of any of clauses 40-48, wherein the first group of apertures is at a center of the aperture array.

50. The apparatus of any of preceding clauses, wherein the apparatus is used for generating multi-modal beamlets for a multi-beam inspection system, and wherein when the multi-beam inspection system is configured to operate in a first mode, the first group of apertures are configured to operate in the pass status, and the second group of apertures are configured to operate in the block status.

51. The apparatus of any of preceding clauses, wherein the apparatus is used for generating multi-modal beamlets for a multi-beam inspection system, and wherein when the multi-beam inspection system is configured to operate in a second mode, the first group of apertures are configured to operate in the block status, and the second group of apertures are configured to operate in the pass status.

52. The apparatus of any of clauses 40-51, wherein the aperture array comprises a third group of apertures having a third size smaller than the second size.

53. The apparatus of clause 52, wherein the third group of apertures surrounds the second group of apertures.

54. The apparatus of any of clauses 52-53, wherein the apparatus is used for generating multi-modal beamlets for a multi-beam inspection system, and wherein
when the multi-beam inspection system is configured to operate in a first mode, the first group of apertures are configured to operate in the pass status, and the second group of apertures and the third group of apertures are configured to operate in the block status,
when the multi-beam inspection system is configured to operate in a second mode, the second group of apertures are configured to operate in the pass status, and the first group of apertures and the third group of apertures are configured to operate in the block status, and
when the multi-beam inspection system is configured to operate in a third mode, the third group of apertures are configured to operate in the pass status, and the first group of apertures and the second group of apertures are configured to operate in the block status.

A non-transitory computer readable medium may be provided that stores instructions for a processor (e.g., processor of controller 109 of FIGS. 1-2) to carry out image processing, data processing, beamlet scanning, database management, graphical display, operations of a charged particle beam apparatus, or another imaging device, or the like. Common forms of non-transitory media include, for example, a floppy disk, a flexible disk, hard disk, solid state drive, magnetic tape, or any other magnetic data storage medium, a CD-ROM, any other optical data storage medium, any physical medium with patterns of holes, a RAM, a PROM, and EPROM, a FLASH-EPROM or any other flash memory, NVRAM, a cache, a register, any other memory chip or cartridge, and networked versions of the same.

The block diagrams in the figures illustrate the architecture, functionality, and operation of possible implementations of systems, methods, and computer hardware or software products according to various exemplary embodiments of the present disclosure. In this regard, each block in a flowchart or block diagram may represent a module, segment, or portion of code, which includes one or more executable instructions for implementing the specified logical functions. It should be understood that in some alternative implementations, functions indicated in a block may occur out of the order noted in the figures. For example, two blocks shown in succession may be executed or implemented substantially concurrently, or two blocks may sometimes be executed in reverse order, depending upon the functionality involved. Some blocks may also be omitted. It should also be understood that each block of the block diagrams, and combination of the blocks, may be implemented by special purpose hardware-based systems that perform the specified functions or acts, or by combinations of special purpose hardware and computer instructions.

It will be appreciated that the embodiments of the present disclosure are not limited to the exact construction that has been described above and illustrated in the accompanying drawings, and that various modifications and changes may be made without departing from the scope thereof.

The invention claimed is:
1. An apparatus comprising:
an aperture array comprising:
a first group of apertures having a first size, and
a second group of apertures having a second size different from the first size; and
wherein the first group of apertures and the second group of apertures are configured to operate in different pass-or-block statuses, and wherein an aperture in a pass status enables a beam to pass through the aperture, and the aperture in a block status stops the beam from passing through the aperture.

2. The apparatus of claim 1, wherein the aperture array is a micro-electromechanical systems aperture array.

3. The apparatus of claim 1, wherein the first size of the first group of apertures is larger than the second size of the second group of apertures.

4. The apparatus of claim 1, wherein the second group of apertures surrounds the first group of apertures.

5. The apparatus of claim 1, wherein the first group of apertures is at a center of the aperture array.

6. The apparatus of claim 1, wherein when the apparatus is configured to operate in a first mode, the first group of apertures are configured to operate in the pass status, and the second group of apertures are configured to operate in the block status.

7. The apparatus of claim 1, wherein when the apparatus is configured to operate in a second mode, the first group of apertures are configured to operate in the block status, and the second group of apertures are configured to operate in the pass status.

8. The apparatus of claim 1, wherein the aperture array comprises a third group of apertures having a third size smaller than the second size.

9. The apparatus of claim 8, wherein the third group of apertures surrounds the second group of apertures.

10. The apparatus of claim 8, wherein: when the apparatus is configured to operate in a first mode, the first group of apertures are configured to operate in the pass status, and the second group of apertures and the third group of apertures are configured to operate in the block status, when the apparatus is configured to operate in a second mode, the second group of apertures are configured to operate in the pass status, and the first group of apertures and the third group of apertures are configured to operate in the block status, and when the apparatus is configured to operate in a third mode, the third group of apertures are configured to operate in the pass status, and the first group of apertures and the second group of apertures are configured to operate in the block status.

11. A method for multi-modal operations of a multi-beam inspection system, the method comprising:
receiving charged particles in the multi-beam inspection system; and
based on an operation mode of the multi-beam inspection system, generating beamlets using an aperture array by controlling a subset of apertures to be in a pass status to enable beamlets to pass through the subset of apertures, and controlling apertures other than the subset of apertures in the aperture array to be in a block status to stop beamlets from passing through the apertures other than the subset of apertures.

12. The method of claim 11, further comprising:
controlling a condenser system to set a projection area of the charged particles to cover the subset of apertures.

13. The method of claim 11 or 12, wherein the aperture array comprises a first subset of apertures having a first size and a second subset of apertures having a second size different from the first size.

14. The method of claim 13, wherein the second subset of apertures surrounds the first subset of apertures.

15. A non-transitory computer-readable medium that stores a set of instructions that is executable by at least one processor of an apparatus to cause the apparatus to perform multi-modal operations of a multi-beam inspection system, the multi-modal operations comprising:
selecting an operation mode of the multi-beam inspection system; and
based on the selected operation mode of the multi-beam inspection system; generating beamlets using an aperture array by controlling a first set of apertures of the aperture array to operate in a pass status to enable beamlets to pass through the first set of apertures; and controlling a second set of apertures of the aperture array to operate in a block status to stop beamlets from passing through the second set of apertures.

* * * * *